US006861201B2

(12) United States Patent
Weed et al.

(10) Patent No.: US 6,861,201 B2
(45) Date of Patent: Mar. 1, 2005

(54) NEAR IR SENSITIVE PHOTOIMAGEABLE/ PHOTOPOLYMERIZABLE COMPOSITIONS, MEDIA, AND ASSOCIATED PROCESSES

(75) Inventors: Gregory C. Weed, Towanda, PA (US); Dietrich M. Fabricius, Hendersonville, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/819,820

(22) Filed: Apr. 7, 2004

(65) Prior Publication Data

US 2004/0191681 A1 Sep. 30, 2004

Related U.S. Application Data

(63) Continuation of application No. 09/775,988, filed on Feb. 2, 2001, now abandoned, which is a continuation-in-part of application No. 08/888,242, filed on Jul. 3, 1997, now abandoned, which is a continuation-in-part of application No. 08/708,476, filed on Sep. 5, 1996, now abandoned.

(51) Int. Cl.$^7$ ............................. G03F 7/031; G03C 7/73

(52) U.S. Cl. ............................. 430/285.1; 430/288.1; 430/281.1; 430/915; 430/920; 430/343; 430/339; 522/26

(58) Field of Search ................................. 430/343, 339, 430/944, 281.1, 285.1, 288.1, 915, 920; 522/26

(56) References Cited

U.S. PATENT DOCUMENTS

| | | | |
|---|---|---|---|
| 3,042,515 A | 7/1962 | Wainer | |
| 3,042,516 A | 7/1962 | Wainer | |
| 3,383,212 A | 5/1968 | Maclachlan | |
| 3,390,995 A | 7/1968 | Manos | |
| 3,390,996 A | 7/1968 | Maclachlan | |
| 3,445,234 A | 5/1969 | Cescon et al. | |
| 3,479,185 A | 11/1969 | Chambers, Jr. | |
| 3,493,376 A | 2/1970 | Fichter, Jr. | |
| 3,563,750 A | 2/1971 | Cescon et al. | |
| 3,585,038 A | 6/1971 | Cescon et al. | |
| 3,615,454 A | 10/1971 | Cescon et al. | |
| 3,615,481 A | 10/1971 | Looney | |
| 3,615,567 A | 10/1971 | Wilson | |
| 3,784,557 A | 1/1974 | Cescon | |
| 4,298,678 A | 11/1981 | McKeever | |
| 4,311,783 A | 1/1982 | Dessauer | |
| 4,332,884 A | 6/1982 | Uji-Ie et al. | |
| 4,356,252 A | 10/1982 | Lee | |
| 4,410,621 A | 10/1983 | Wada et al. | |
| 4,423,139 A | 12/1983 | Isbrandt et al. | |
| 4,495,020 A | 1/1985 | Nakabayashi et al. | |
| 4,551,413 A | 11/1985 | Bell | |

(List continued on next page.)

FOREIGN PATENT DOCUMENTS

| | | |
|---|---|---|
| DE | 4240141 A | 6/1994 |
| EP | 0243936 | 11/1987 |
| EP | 0300410 A | 1/1989 |
| EP | 356236 | 2/1990 |
| EP | 0437259 A | 7/1991 |
| EP | 0321923 B | 7/1992 |
| JP | 59-72438 | 4/1984 |
| JP | 60-95430 | 5/1985 |
| JP | 60-98433 | 6/1985 |
| JP | 60-191238 | 9/1985 |
| JP | 5-229251 | 9/1993 |
| JP | 5-301448 | 11/1993 |
| JP | 7-327738 | 2/1995 |
| JP | 7-228051 | 8/1995 |
| JP | 8-39935 | 2/1996 |
| JP | 8297364 | 12/1996 |

OTHER PUBLICATIONS

PTO 99–3373, English translation of Japan 08–297364, Showa Denko KK, translation by Schreiber Translation, Inc, United STates Patent and Trademark Office, Washington D.C. Jun. 1999, pp. 1–49.*

Photoinitiators for Free–Radical–Initiated Photoimaging Systems, B. Monroe and G. Weed, Chem. Rev., 93, p. 435–448 (1993).

Photopolymers: Radiation Curable Imaging Systems, B.M. Monroe, Chapter 10 in Radiation Curing: Science and Technology, edited by S. P. Pappas, Plenum Press, New York, (1992).

PTO 99–3373, English translation of Japan 08–297364, Showa Denko KK, translated by Schreiber Translations, Inc., United States Patent and Trademark Office, Washington, DC, Jun. 1999, pp. 1–49.

Primary Examiner—Cynthia Hamilton
(74) Attorney, Agent, or Firm—Thomas H. Magee

(57) ABSTRACT

Novel photopolymer compositions are disclosed which contain dyes that absorb strongly in the near infrared (near IR) region of the electromagnetic spectrum. These dyes are useful as photosensitizers for initiating a variety of photoimaging and photopolymerization reactions. Imaging Media are disclosed herein which are sensitive in the near infrared (near IR) region of the electromagnetic spectrum and which can initiate polymerization of ethylenically unsaturated monomer components in negative-acting photopolymer systems and/or which can initiate conversion of a leuco dye to its corresponding colored dye form. These imaging media comprise either a near IR dye photochemical sensitizer, a hexaarylbiimidazole (HABI) photoinitiator, a chain transfer agent, and a photopolymerizable material or a near IR dye photochemical sensitizer, a hexaarylbiimidazole (HABI) photoinitiator, and a leuco dye. These imaging media are useful in a variety of photopolymer products, including photoresists, proofing films, and holographic recording films.

8 Claims, No Drawings

U.S. PATENT DOCUMENTS

| | | |
|---|---|---|
| 4,581,325 A | 4/1986 | Kitchin et al. |
| 4,622,286 A | 11/1986 | Sheets |
| 4,634,657 A | 1/1987 | Holman, III |
| 4,636,459 A | 1/1987 | Kawamura et al. |
| 4,656,121 A | 4/1987 | Sato et al. |
| 4,743,091 A | 5/1988 | Gelbart |
| 4,882,265 A | 11/1989 | Laganis et al. |
| 4,929,530 A | 5/1990 | Saeki et al. |
| 4,942,141 A | 7/1990 | DeBoer et al. |
| 4,962,009 A | 10/1990 | Washizu et al. |
| 4,973,572 A | 11/1990 | DeBoer |
| 4,981,769 A | 1/1991 | Saeki et al. |
| 5,019,549 A | 5/1991 | Kellogg et al. |
| 5,051,333 A | 9/1991 | Yanagihara et al. |
| 5,093,492 A | 3/1992 | Acker et al. |
| 5,146,087 A | 9/1992 | VanDusen |
| 5,156,938 A | 10/1992 | Foley et al. |
| 5,171,650 A | 12/1992 | Ellis et al. |
| 5,286,604 A | 2/1994 | Simmons, III |
| 5,330,884 A | 7/1994 | Fabricius et al. |
| 5,407,783 A | 4/1995 | Caruso |
| 5,440,042 A | 8/1995 | Fabricius et al. |
| 5,536,626 A | 7/1996 | Fabricius et al. |
| 5,576,443 A | 11/1996 | Fabricius et al. |

\* cited by examiner

NEAR IR SENSITIVE PHOTOIMAGEABLE/ PHOTOPOLYMERIZABLE COMPOSITIONS, MEDIA, AND ASSOCIATED PROCESSES

CROSS REFERENCE TO RELATED APPLICATIONS

This is a continuation of U.S. patent application Ser. No. 09/775,988 filed Feb. 2, 2001, now abandoned, which is a continuation-in-part of U.S. patent application Ser. No. 08/888,242 filed Jul. 3, 1997, now abandoned, which is incorporated herein by reference in its entirety, which is a continuation-in-part of U.S. patent application Ser. No. 08/708,476 filed Sep. 5, 1996, now abandoned.

FIELD OF THE INVENTION

The invention is in the area of photopolymer compositions and photoimaging media (elements) and associated processes that can be photoimaged and/or photopolymerized by actinic radiation in the near-IR range (~770–1500 nm) of the electromagnetic spectrum.

BACKGROUND OF THE INVENTION

Various dyes are known to the art that are infrared (IR) absorbers and which can act as photothermal sensitizers for various reactions that are initiated using near IR radiation. Examples include the SQS and related squarylium dyes disclosed in U.S. Pat. No. 5,019,549 which are useful dyes for use in donor elements for laser-induced thermal imaging processes.

The hexaarylbiimidazoles (HABIs) are a very useful class of photoinitiators that are widely known to those skilled in the art and which are used in many photopolymer products. Some key HABI review articles include the following: "Photoinitiators for Free-Radical-Initiated Photoimaging Systems", B. Monroe and G. Weed, Chem. Rev., 93, p. 435–448 (1993), see p. 440–441 for the section on HABIs; and "Photopolymers: Radiation Curable Imaging Systems" by B. M. Monroe, Chapter 10 in Radiation Curing: Science and Technology, edited by S. P. Pappas, Plenum Press, New York, (1992), see p. 407–412 for the section on HABIs.

There are various compounds known that are sensitizers of HABIs for photopolymer processes effected with actinic radiation in the ultraviolet and visible regions of the electromagnetic spectrum. It would be very desirable to have efficient sensitizers of HABIs for photopolymer processes in the near infrared (~770–1500 nm) of the electromagnetic spectrum, particularly since this type of actinic radiation is readily available from inexpensive diode lasers that can be employed for direct digital imaging. Efficient sensitizers of HABIs active in the near infrared are not currently known to the art, and there is a strong need to have efficient sensitizers of HABIs with sensitization in the near infrared region of the electromagnetic spectrum.

In Japanese patent publication 08-297364, there are disclosed some near infrared cationic dyes present in photosensitive image-forming sheets that sensitize HABIs. All of these dyes though have a borate anion, which is a well-known coinitiator of HABI(s), present as counterion. Since borate anion is present in these compositions, the dyes would sensitize HABIs. Having a borate anion present as counterion can be disadvantageous, since this anion is relatively large tending to impart limited solubility to the dye and hence likely making it difficult to tailor properties of compositions comprising these dyes. These compositions are comprised of three essential components—near IR dye, borate anion, and HABI. A two component composition—near IR dye and HABI—of the present invention obviates the need for the large borate anion.

SUMMARY OF THE INVENTION

Novel photopolymer compositions and photoimaging media (elements) are disclosed which contain dyes that absorb strongly in the near infrared (near IR) region of the electromagnetic spectrum. These dyes are useful as efficient photosensitizers in sensitizing photoinitiators that can initiate photopolymerization and other photoimaging reactions. These photopolymer compositions and photoimaging media are sensitive in the near infrared (near IR) region of the electromagnetic spectrum and are characterized in undergoing polymerization of ethylenically unsaturated monomer components or other photopolymerizable materials, preferably in negative-acting photopolymer systems, and/or other photoimaging reactions that are initiated by exposure to near IR actinic radiation. These compositions and photoimaging media, in a first embodiment, comprise a near IR dye photochemical sensitizer, which is substantially free of borate anion, a hexaarylbiimidazole (HABI) compound as photoinitiator, a chain transfer agent, and a photopolymerizable material, which preferably is an ethylenically unsaturated monomer. These compositions and photoimaging media, in a second embodiment, comprise a near IR dye photochemical sensitizer, which is substantially free of borate anion, a hexaarylbiimidazole (HABI) compound as photoinitiator, and a leuco dye. Additional embodiments involve processes using the compositions of this invention and elements containing the compositions of this invention. These compositions and photoimaging media are useful in a variety of photopolymer products, including photoresists, solder masks, proofing films, flexographic printing products, and holographic recording films.

DETAILED DESCRIPTION OF THE INVENTION

A key aspect of the present invention is the discovery that certain dyes that absorb in the near infrared and which are substantially free of a borate anion are efficient sensitizers of hexaarylbiimidazoles (HABIs), which as a class of photoinitiators are well known to those skilled in the art to be difficult to sensitize especially in the longer wavelength regions. Furthermore, in sharp contrast to many known photosensitizers, the photosensitizers of this invention are effective in bringing about polymerization upon exposure in a photopolymerizable film over a considerably larger film thickness in comparison to what the known sensitizers can do. While not being bound by any theory, the photosensitizers of this invention are believed to act via a photochemical mechanism that involves, after excitation of the photosensitizer to an excited state upon exposure to actinic radiation, electron transfer from the excited photosensitizer to the HABI and then subsequent cleavage of the HABI to give a triarylimidazole radical (lophyl radical). The lophyl radical may either serve as the initiator directly or may indirectly afford via reaction with a hydrogen donor other radical(s) that serve to initiate photopolymerization and/or photoimaging. If the oxidation potential of the near IR photosensitizer is too high in relation to the reduction potential of the HABI, then electron transfer will be inefficient or may not occur at all, and the near IR photosensitizer will not be a photochemical sensitizer of the HABI. If, on the other hand, the oxidation potential of the near IR photosensitizer is suitably low in relation to the reduction potential of the HABI, then according to the well-known Marcus theory for electron transfer, the donation of an electron from the dye to the HABI should be efficient and the dye may be an efficient photochemical sensitizer of the HABI initiator.

The present invention, therefore, relates to a method for generating HABI radicals which act as photoinitiators in photochemical compositions comprising exposing a composition comprising a near IR dye; a HABI photoinitiator; and a photoactivatable compound to near infrared radiation wherein the near IR dye is activated to an excited state IR dye* which subsequently transfers an electron to the HABI photoinitiator which leads to the formation of HABI radicals. In a specific embodiment the near infrared absorbing dye is free of borate anion in which regard the invention may be considered to consist essentially of the near infrared absorbing dye and the HABI together with the other ingredients.

In a first embodiment which entails photopolymerization of a photopolymerizable (photohardenable) material to afford photopolymerized (photohardened) photopolymer, the compositions are comprised of the following components:

1) a photoinitiator system; which comprises:
  A) a near IR dye photochemical sensitizer; and
  B) a hexaarylbiimidazole (HABI) compound as photoinitiator;
2) a chain transfer agent; and
3) a photopolymerizable material, which preferably is an ethylenically unsaturated monomer, with the proviso that the near IR dye photochemical sensitizer is substantially free of borate anion.

In a second embodiment which entails photoimaging of a photoimageable material to afford an image comprising photoimaged photopolymer, the photoimageable compositions are comprised of the following components:

1) a photoinitiator system; which comprises:
  A) a near IR dye photochemical sensitizer; and
  B) a hexaarylbiimidazole (HABI) compound as photoinitiator; and
2) a leuco dye,
with the proviso that the near IR dye photochemical sensitizer is substantially free of borate anion.

Both the compositions of the first embodiment and the compositions of the second embodiment may contain additional components, such as other components that are typically present in photopolymer compositions. The additional components include but are not limited to polymeric binder(s), additional components of the types named above (e.g., additional HABI initiator(s), additional leuco dye(s), additional monomer(s), etc.), as well as other optional components such as fillers, pigments, surfactants, adhesion modifiers, scum formation modifiers, and the like. Furthermore, the compositions of the first embodiment may contain but are not required to contain leuco dye(s), and the compositions of the second embodiment may contain but are not required to contain photopolymerizable (photohardenable) material(s).

Unless specifically indicated otherwise, the discussion presented below on the component specifications and details applies equally to both the first and second embodiments of this invention.

HABI Photoinitiator/Near IR Photosensitizer Photoinitiator System

The photoinitiator or photoinitiating system includes one or more hexaarylbiimidazole (HABI) compounds which directly furnish free-radicals when activated by actinic radiation. By "actinic radiation" is meant radiation which allows formation of the free-radicals necessary to initiate polymerization of the monomer. This photoinitiating system can also include a plurality of compounds, one or more of which yields the free-radicals after having been caused to do so by another compound, a photosensitizer or sensitizer, which is activated by the radiation. The photosensitizer in this invention extends spectral response into the near infrared (near-IR) spectral region. Also radiation employing a laser can be employed in specific situations.

Substituted 2,4,5,2',4',5'-hexaarylbiimidazole dimers (HABIs) useful in the invention are disclosed in: Chambers, U.S. Pat. No. 3,479,185; Cescon, U.S. Pat. No. 3,784,557; Dessauer, U.S. Pat. No. 4,311,783; and Sheets, U.S. Pat. No. 4,622,286. Preferred dimers of this class are 2-o-chlorosubstituted hexaphenylbiimidazoles in which the other positions on the phenyl radicals are unsubstituted or substituted with chloro, methyl or methoxy, such as: CDM-HABI, i.e., 2-(o-chlorophenyl)-4,5-bis(m-methoxyphenyl)-imidazole dimer; o-Cl-HABI, i.e., biimidazole, 2,2'-bis(o-chlorophenyl)-4,4'5,5'-tetraphenyl-; and TCTM-HABI, i.e., 1H-imidazole, 2,5-bis(o-chloro-phenyl)-4-[3,4-dimethoxyphenyl]-, dimer, each of which is typically used with a hydrogen donor or chain transfer agent. Especially preferred initiators of this class for this invention are ortho-Cl-HABI, i.e., 1,1'-biimidazole, 2,2'-bis(ortho-chlorophenyl)-4,4',5,5'-tetraphenyl-imidazole dimer and 2,3,5-TCl-HABI, i.e., 2,2'-bis(2,3,5-trichlorophenyl)-4,4',5, 5'-tetraphenyl-1,1'-biimidazole.

The near infrared photosensitizers of this invention are those having the generic formula shown in Table 1 following the examples or the specific formula described herein or shown in Table 2.

As shown in Table 1, the infrared sensitive dye is chosen from a compound of Formula I wherein substituent A is chosen from (1) a 5–6 membered heterocyclic ring system having 1–3 ring heteroatoms selected from N which are substituted with H, $C_1$–$C_6$ alkyl, $(CH_2)_m CO_2 H$ or $(CH_2)_m CO_2(C_1$–$C_6$ alkyl) and a C atom of the heterocyclic ring system may be substituted with oxygen to form a carbonyl or enolate anion and m is 0–4;

(2) A 5–6 membered carbocyclic moiety substituted with H, $C_1$–$C_6$ alkyl wherein a carbon atom of the carbocyclic moiety may be substituted with oxygen to form a carbonyl or enolate anion;

(3) quinoline or isoquinoline wherein the nitrogen is directly bonded to the carbocyclic moiety of formula I;

(4) N,N-bisaryl or bis($C_1$–$C_6$ alkyl) or bisaryl($C_1$–$C_6$ alkyl)amine wherein the aryl group is chosen from napthyl or phenyl which is unsubstituted or substituted with substituents chosen from F, Br, Cl, $OCH_3$, $CF_3$, OH, $C_1$–$C_6$ alkyl or aryl $C_6$–$C_{10}$, such as phenyl or naphthyl;

(5) a heterocyclic ring system having at least one nitrogen bonded directly to the carbocyclic ring of formula I and a group Z selected from C, $NR^8$, O or S wherein $R^8$ is chosen from H, $C_1$–$C_6$ alkyl, $CO_2H$ or $CO_2C_1$–$C_6$ alkyl;

substituent $D_1$ is chosen from a 9–15 membered heterocyclic system such as a heteroaryl ring system having at least one heteroatom (U) chosen from $NR^3$, O, S or $PR^3$ which is directly bonded to the aryl portion of the heteroaryl ring system and wherein $R^3$ is chosen from $C_1$–$C_6$ alkyl which may be unsubstituted or substituted with $CO_2H$, $SO_3H$ or salts thereof and wherein the aryl ring may be unsubstituted or substituted with substituents selected from $OCH_3$, $CF_3$, Br, Cl, F, $C_1$–$C_6$ alkyl, OH or substituent $D_1$ may be a fused ring heterocyclic system such as when heterocyclic rings are fused to form a polycyclic structure;

substituent $D_2$ has the identical heterocyclic ring system as $D_1$, which may be heteroaryl or fused ring heterocyclic system, except that when U is $NR_3$, the nitrogen is quaterinized to form an amine salt which is neutralized by an enolate anion from A when A is a substituted pyrimidine like moiety or by a discrete (non intra-molecular) anion;

n is chosen from 1–2.

The near infrared photosensitizers within the scope of this invention include, but are not limited to, the following dye compounds as defined in the glossary: DF-15131, DF-15118, DF-1668, DF-15132, DF-1413, DF-1419, DF-1429, DF-1422, NK-2268, NK-3877, GW-826, DF-12124, GW-976, GW-436, GW-186, and GW-776. Dye compounds that are preferred as photosensitizers include, but are not limited to, the following: DF-15132, NK-3877, KF-634, DF-1668, DF-1413, DF-15118, DF-15131, GW-826, GW-976, and GW-186. Dye compounds that are most preferred as photosensitizers according to the invention are the following: DF-1413, DF-15118, DF-15131, GW-826, GW-976, and GW-186. The basis for the above preferences is relative efficacy of the dye as a near IR photosensitizer.

The solubility characteristics of the dye provide another basis for preferences in dye selection. In this regard, zwitterion dyes that are charge neutral are preferred in coating photopolymer compositions from an organic solvent(s), such as methyl ethyl ketone or methanol, since these zwitterionic dyes have significantly higher (better) solubility characteristics in organic solvents and are less prone toward crystallization of solids in the compositions during coating and/or use. In some cases, these zwitterionic dyes can lead to other performance advantages of the compositions of this invention. For compositions coated from organic solvents, dyes having the zwitterionic bartituric acid moiety (i.e., 2-[2,4,6-trioxo-1,3-pyrimidin-5-yl]) or related zwitterionic moieties are preferred. Such dyes are charge neutral and do not contain a counterion, such as a halide anion, that is present in other dyes that are not charge neutral. Dyes within the scope of the invention having the bartituric acid moiety and which are preferred on the basis of solubility characteristics include, but are not limited to, DF-1413, DF-1419, DF-1422, DF-1668, DF-1429, DF-15118, DF-15131, and DF-15132.

Dye compounds that were tested (see comparative examples) and found to be inoperable and which are consequently outside the scope of the invention include the following: SQS.

The quantity of photoinitiator system (including photosensitizer(s) and photoinitiator(s) to comprise the photoinitiator system) in a photopolymerizable composition of this invention is typically from 0.5 to 10 parts by weight relative to the total components, preferably is from about 1 to about 5 parts by weight relative to the total components, and most preferably is from about 2 to about 3 parts by weight relative to the total components. The ratio of photosensitizer(s) to photoinitiator(s) in parts by weight of the total photoinitiator system of this invention is typically from about 0.02 to about 1.0, preferably is from about 0.03 to about 0.5, and most preferably is from about 0.04 to about 0.2.

Chain Transfer Agent

Hexarylbiimidazole (HABI) photoinitiators are known to those skilled in the art to be generally ineffective toward initiating photopolymerization of an ethylenically unsaturated monomer unless there is present in the photopolymerizable composition a chain transfer agent (hydrogen donor). When a suitable chain transfer agent is present in the composition, then a HABI photoinitiator is very effective and efficient in initiating the polymerization of ethylenically unsaturated monomer(s) to afford photopolymerized photopolymer. For this reason, a suitable chain transfer agent is a necessary and required component in the photopolymerizable (photohardenable) compositions of the first embodiment of this invention. The chain transfer agent generally must be present in an amount in the range from about 0.1 to about 2 parts by weight based on the total composition. Preferably, the chain transfer agent is present in an amount in the range from about 0.5 to about 1.0 parts by weight based on the total composition.

In sharp contrast, HABI photoinitiators are known to be effective during photoimaging in oxidizing a leuco dye to the corresponding colored dye form to form an image even in the absence of a chain transfer agent. Thus, for the compositions of the second embodiment of this invention, a chain transfer agent is not required since there is effective photoimaging in its absence, but it is nevertheless an optional component in these compositions.

Suitable chain transfer agents according to this invention include, but are not limited to, the following: N-arylglycine, such as for example, N-phenylglycine; julolidine; N,N-dialkylamino aromatics, where the alkyl groups are independently $C_1$–$C_6$ alkyl, and representative examples include Michler's Ketone, leuco crystal violet and other aminotriarylmethane leuco dyes, and 2,6-diisopropyl-N,N-dimethylaniline; 2-mercaptobenzoxazole; 1,1-dimethyl-3,5-diketocyclohexane, or organic thiols, e.g., 2-mercaptobenzothiazole; 2-mercaptobenzoxazole; 2-mercaptobenzimidazole; pentaerythriotol tetrakis (mercaptoacetate); 4-acetamidothiophenol; mercaptosuccinic acid; dodecanethiol; beta-mercaptoethanol; beta-mercaptoethanol; or other organic thiol. Preferred chain transfer agents for this invention include N-phenylglycine, 2,6-diisopropyl-N,N-dimethylaniline, and julolidine.

Photopolymerizable Material

The first embodiment of this invention involves compositions that contain a photopolymerizable material that undergoes photopolymerization upon exposure to near infrared actinic radiation to afford a polymerized photopolymer. In general, the invention scope is considered to include any photopolymer systems known in the art which undergo photopolymerization upon exposure to actinic radiation to afford polymerized photopolymer. Suitable photopolymer systems include, but are not limited to, negative working systems in which at least one ethlenically unsaturated monomer is photopolymerized to photopolymerized photopolymer, negative working systems, such as poly(vinyl cinnamate) that involve cycloaddition reactions to afford photopolymerized photopolymer, and positive working systems, such as those of the diazaquinone type that afford acid functionality that is developable in aqueous alkali upon exposure to actinic raidation. Discussion of these different photopolymer systems can be found in many references, such as, for example, *Photoreactive Polymers, The Science and Technology of Resists*, by Arnost Reiser, John Wiley & Sons, New York, 1989.

The preferred choice for the photopolymerizable material is an ethylenically unsaturated monomer. Suitable monomers useful herein are well known in the prior art and typically undergo free radical initiated polymerization. In the compositions of this invention that contain an ethylenically unsaturated monomer, the composition contains at least one or a mixture of such components. In general, preferred monomers for photopolymer applications have boiling points greater than 100° C. (at 760 mm Hg, 1 atmosphere), more preferably, greater than 150° C. (at 760 mm Hg, 1 atmosphere). Numerous unsaturated monomers polymerizable by free-radical initiated polymerization and useful in photopolymerizable compositions are known to those skilled in the art.

The monomer provides the capability of the photopolymer coating composition to photopolymerize and contributes to overall properties. In order to effectively do so, the monomer should contain at least one ethylenically unsaturated group capable of undergoing polymerization on exposure to actinic radiation.

The preferred monomeric compounds are polyfunctional, but monofunctional monomers, such as (meth)acrylate esters of polycaprolactone, can also be used. Suitable monomers which can be used as the sole monomer or in combination with others include the following: diethylene glycol diacrylate, tripropylene glycol diacrylate, trimethylolpropane triacrylate, pentaerythritol triacrylate, ethoxylated trimethylolpropane tri(meth)acrylate, propoxylated trimethylolpropane tri(meth)acrylate and similar compounds as disclosed in U.S. Pat. No. 3,380,831, triethylene glycol dimethacrylate, bisphenolA di(meth)-acrylate, di-(2-methacryloxyethyl)ether of bisphenol-A, di-(3-acryloxy-2-hydroxypropyl)ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl)ether of tetrabromo-bisphenol-A, di-(2-methacryloxyethyl)ether of tetrabromo-bisphenol-A, ethoxylated bisphenol-A di(meth)acrylate, propoxylated bisphenol A di(meth)-acrylate, diacrylate of bisphenol-A diglycidyl ether and poly-caprolactone diacrylate.

A particularly preferred class of monomers or comonomers is tripropylene glycol diacrylate, trimethylolpropane triacrylate, ethoxylated trimethylolpropane triacrylate, propoxylated trimethylolpropane triacrylate, ethoxylated Bisphenol A dimethacrylate, and triethylene glycol dimethacrylate. The polymerizable material can be present in any amount from 0 to about 70 weight percent. For the first embodiment, it is normally present in an amount from 20 to 70 weight percent.

Binder Polymers

The compositions of this invention most often preferably contain one or more binder polymer as optional component(s).

The binder polymers present in the compositions of this invention are not required to but preferably do contain acid functionality for aqueous processability (aqueous development), which is preferably achieved by incorporating one or more carboxyl-containing comonomers into the binder polymer. Preferred polymers for the instant invention also contain styrene as a comonomer. Suitable polymers for the instant invention contain 0–50 weight percent styrene as comonomer, have an acid number in the range 90–160, have a molecular weight (weight average) in the range 20,000–300,000, and have a glass transition temperature in the range 50–120° C. Preferably, the binders contain 5–40% styrene as comonomer, have an acid number in the range 110–140, have a molecular weight (weight average) in the range 40,000–200,000, and have a glass transition temperature in the range 60–110° C. Most preferably, the polymers contain 10–30% styrene as comonomer, have an acid number in the range 125–135, have a molecular weight (weight average) in the range 60,000–100,000, and have a glass transition temperature in the range 70–100° C.

Preferred polymer binders are acid-containing copolymers or homopolymers comprised of at least one acid-containing monomer of structural unit:

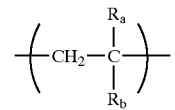

in which $R_a$ is H, phenyl, or alkyl; $R_b$ is $CO_2R_c$, $SO_3R_d$, or other acidic functional group; and $R_c$ and $R_d$ are H or alkyl, which is unsubstituted or hydroxyl-substituted. Alkyl groups can contain one to twelve carbon atoms and preferably one to eight. Comonomers, which are suitable for forming the binder copolymer, are styrene and unsaturated carboxylic acids and their derivatives, such as (meth)acrylic acid and (meth)acrylates. Acrylic acid, methacrylic acid, methyl methacrylate, styrene, ethyl acrylate, ethyl methacrylate, butyl methacrylate, butyl acrylate, maleic anhydride, 2-hydroxyethyl methacrylate, and 2-ethylhexyl methacrylate are preferred.

Suitable binder copolymers can be formed by direct copolymerization of one or more ethylenically unsaturated dicarboxylic acid anhydrides, or the corresponding alkyl diesters, with one or more of the above comonomers. Suitable ethylenically unsaturated dicarboxylic acid anhydrides are, for example, maleic anhydride, itaconic acid anhydride and citraconic acid anhydride and alkyl diesters such as the diisobutyl ester of maleic anhydride. The copolymer binder containing acid anhydride functionality can be reacted with primary aliphatic or aromatic amines to produce acid and amide functionality.

A preferred acid-containing binder for aqueous processability in use as well as aqueous coatability in dry film manufacture is a carboxylic acid-containing copolymer, such as those disclosed in U.S. Pat. Nos. 3,458,311 and 4,273,857, and which can be prepared by any of the addition polymerization techniques known to those skilled in the art such as described therein. The level of carboxylic acid groups is determined for a given composition by optimizing the amount needed for good development in aqueous alkaline developer.

When a negative-working aqueous processable photoresist, solder mask, proofing film, or flexographic plate is laminated to a substrate and photoprinted, development of the photoresist, solder mask, proofing film, or flexographic plate composition may require that the binder material should contain sufficient carboxylic acid groups to render the photoresist, solder mask, proofing film, or flexographic plate coating composition processable in aqueous alkaline developer. The photoresist, solder mask, proofing film, or flexographic plate coating layer will be removed in portions which are not exposed to radiation but will be substantially unaffected in exposed portions during development by aqueous alkaline liquids such as wholly aqueous solutions containing 1% sodium carbonate by weight at a temperature of 30° C. for 1–2 minutes.

For those applications where the development is effected using solvent development with an organic liquid developer or semiaqueous development with a liquid mixture containing water and organic solvent(s), it is not required that the binder(s) have acid-containing functionality, such as carboxylic acid functionality. In these cases, all of the comonomers for the binder(s) can be non-acid containing comonomers.

Leuco Dye

The leuco form of the dye which comprises one component of a photoimaging composition of the present invention is the reduced form of the dye having one or two hydrogen atoms, the removal of which together with an additional electron in certain cases produces the dye. Such dyes have been described, for example, in U.S. Pat. No. 3,445,234, column 2, line 49 to column 8, line 55. The following classes are included:

(a) aminotriarylmethanes
(b) aminoxanthenes
(c) aminothioxanthenes
(d) amino-9,10-dihydroacridines
(e) aminophenoxazines
(f) aminophenothiazines
(g) aminodihydrophenazines
(h) aminodiphenylmethanes
(i) leuco indamines
(j) aminohydrocinnamic acids (cyanoethanes, leuco methines)
(k) hydrazines
(l) leuco indigoid dyes
(m) amino-2,3-dihydroanthraquinones
(n) tetrahalo-p,p'-biphenols
(o) 2(p-hydroxyphenyl)-4,5-diphenylimidazoles
(p) phenethylanilines Of these leuco forms, (a) through (i) form the dye by losing one hydrogen atom, while the leuco forms (j) through (p) lose two hydrogen atoms to produce the parent dye. Aminotriarylmethanes are preferred. A general preferred aminotriarylmethane class is that of the acid salts of aminotriarylmethanes wherein at least two of the aryl groups are phenyl groups having (a) an $R_eR_fN$-substituent in the position para to the bond to the methane carbon atom wherein $R_e$ and $R_f$ are each groups selected from hydrogen, $C_1$ to $C_{10}$ alkyl, 2-hydroxyethyl, 2-cyano-ethyl, or benzyl and, optionally, (b) a group ortho to the methane carbon atom which is selected from lower alkyl (C is 1 to 4), lower alkoxy (C is 1 to 4), fluorine, chlorine or bromine; and the third aryl group may be the same as or different from the first two, and when different is selected from (a) Phenyl which can be substituted with lower alkyl, lower alkoxy, chloro, diphenylamino, cyano, nitro, hydroxy, fluoro or bromo;
(b) Naphthyl which can be substituted with amino, di-lower alkylamino, alkylamino;
(c) Pyridyl which can be substituted with alkyl;
(d) Quinolyl;
(e) Indolinylidene which can be substituted with alkyl.

Preferably, $R_e$ and $R_f$ are hydrogen or alkyl of 1–4 carbon atoms. Leuco dye is present in 0.1 to 5.0 percent by weight of solids in the photoimaging composition.

With the leuco form of dyes which have amino or substituted amino groups within the dye structure and which are characterized as cationic dyes, an amine salt-forming mineral acid, organic acid, or an acid from a compound supplying acid is employed. The amount of acid usually varies from 0.33 mol to 1 mol per mol of amino nitrogen in the dye. The preferred quantity of acid is about 0.5 to 0.9 mol per mol of amino nitrogen. Representative acids which form the required amine salts are hydrochloric, hydrobromic, sulfuric, phosphoric, acetic, oxalic, p-toluenesulfonic, trichloroacetic, trifluoroacetic and perfluoroheptanoic acid. Other acids such as acids in the "Lewis" sense or acid sources which may be employed in the presence of water or moisture include zinc chloride, zinc bromide, and ferric chloride. Representative leuco dye salts include tris-(4-diethylamino-o-tolyl)methane zinc chloride, tris-4-diethylamino-o-tolyl)methane oxalate, tris-(4-diethylamino-o-tolyl)methane p-toluene-sulfonate and the like.

Aminotriarylmethanes and salts thereof are preferred leuco dyes in this invention. Especially preferred aminotriarylmethane leuco dyes according to this invention include, but are not limited to, LCV, LECV, LPCV, LBCV, LV-1, LV-2, LV-3, aminotriarylmethane leuco dyes having different alkyl substituents bonded to the amino moieties wherein each alkyl group is independently selected from $C_1-C_4$ alkyl, and aminotriarylmethane leuco dyes comprising any of the preceding named structures that are further substituted with one or more alkyl groups on the aryl rings wherein the latter alkyl groups are independenly selected from $C_1-C_3$ alkyl. The most preferred aminotriarylmethane leuco dyes according to this invention are LCV, LECV, LV-1, LV-2, and LV-3. The leuco dye can be present in the compositions in any amount from 0 to about 20 weight percent. In embodiment 2, it will normally be present in an amount from 0.5 to about 10 weight percent.

Optional Ingredients

Other compounds conventionally added to proofing films, flexographic printing plates, photoresist, solder mask, and other related photopolymer compositions may also be present in the coating to modify the physical properties of the film. Such components include: adhesion modifiers, thermal stabilizers, a printout image system comprising colorants such as dyes and pigments, viscosity control agents, coating aids, wetting agents, surfactants, release agents, fillers, crosslinking agents, and the like.

Examples of suitable printout image systems are the following: 2,2'-bis(o-chlorophenyl)-4,4',5,5'-tetraphenyl-1,1'-biimidazole and Leuco Crystal Violet (LCV); 1,2-dibromotetrachloroethane and LCV; tribromomethyl phenylsulfone (BMPS) and LCV; and 2,3-dibromo-3-phenylpropiophenone (BPP) and LCV.

Some heterocyclic compounds improve adhesion of the coating to copper-clad substrates or prevent residue formation during processing in a resist or related application. Suitable heterocyclic components include materials such as those disclosed in Hurley et al., U.S. Pat. No. 3,622,334, Jones, U.S. Pat. No. 3,645,772, and Weed, U.S. Pat. No. 4,710,262. Preferred heterocyclic components include benzotriazole, 5-chloro-benzotriazole, 1-chloro-benzotriazole, 4- and 5-carboxy-benzotriazole, 1-hydroxy-benzotriazole, 2-mercapto-benzoxazole, 1H-1,2,4-triazole-3-thiol, 5-amino-1,3,4-thiodiazole-2-thiol, and mercapto-benzimidazole.

Thermal polymerization inhibitors that can be used in the coating compositions are: p-methoxyphenol, hydroquinone, alkyl- and aryl-substituted hydroquinones and quinones, tert-butyl catechol, 2,6-di-tert-butyl-p-cresol, and phenothiazine. Also useful for thermal polymerization inhibitors are the nitroso compositions disclosed in U.S. Pat. No. 4,168, 982.

Various dyes and pigments may be added to increase the visibility of the photopolymer image. Any colorant used, however, should preferably be transparent to the actinic radiation. Representative dyes include leuco crystal violet, Victoria green dye, Victoria blue dye, and Neozapon red dye.

In the case of a photoimageable solder mask composition, there will be in addition to the key components listed above a crosslinking agent present to provide for curing of the imaged resist. Suitable crosslinking agents include an adduct of a polyisocyanate compound and a isocyanate group blocking agent, and formaldehyde condensation resins with melamines, ureas, benzguanidines, and the like.

A suitable photodeactivation compound can be employed in this invention. Preferred are various quinone compounds. A quinone redox couple useful in the photoimaging composition is described in U.S. Pat. No. 3,658,543, column 9, lines 1 to 46, incorporated by reference. Preferred oxidants include 9,10-phenanthrenequinone alone or in admixture with 1,6- and 1,8-pyrenequinone which absorb principally in the 430 to 550 nm region. The reductant component of the redox couple is 100 to 10 percent of an acyl ester of triethanolamine of the formula:

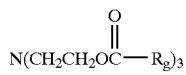

where $R_g$ is alkyl of 1 to 4 carbon atoms, and 0 to 90 percent of a $C_1$ to $C_4$ alkyl ester of nitrioltriacetic acid or of 3,3',3"-nitrilotripropionic acid. Triethanolamine triacetate and dibenzylethanolamine acetate are preferred reductant components. The molar ratios of oxidants to biimidazole used ranges from 0.01:1 to 2:1, preferably 0.2:1 to 0.6:1. The molar ratios of reductant biimidazole used ranges from about 1:1 to about 90:1, preferably 10:1 to 20:1.

Materials of Construction

Any of the support films known for use as such for a photoimageable coating can be used as a temporary support for coating the photoimageable material onto in the application of the present invention. The temporary support film, which preferably has a high degree of dimensional stability to temperature changes, may be chosen from a wide variety of polyamides, polyolefins, polyesters, vinyl polymers, and cellulose esters, and may have a thickness of from about 6 to 200 microns. A particularly suitable support film is polyethylene terephthalate having a thickness of about 25 microns.

In a photoimageable film it is necessary or at least highly desirable to protect the photosensitive layer by a removable cover film in order to prevent blocking when it is stored in a roll form. The protective cover film is removed prior to lamination of the photoimageable element to a substrate.

The protective cover film may be selected from the same group of high polymer films described for the temporary support film, supra, and may have the same wide range of thicknesses; however, it is preferable to use a cover sheet that is relatively flexible under lamination conditions. A cover sheet of 25 microns thick polyethylene or polypropylene is especially suitable.

Preferred Ranges

The preferred ranges of components for the photopolymerizable compositions of the first embodiment of this invention are about 30 to 80 parts by weight of the polymer (s) (binder(s), polymeric binder(s)); about 10 to 50 parts by weight of photopolymerizable material(s); and about 0.5 to 10 parts by weight of the photoinitiator system comprised of a near IR photosensitizer and a HABI photoinitiator. The preferred ranges of components for the photoimageable (2nd) embodiment of this invention are 0 to about 70 parts by weight of polymers, about 0.1 to about 10 parts by weight of leuco dye(s), and about 0.5 to 10 parts by weight of the photoinitiator system comprised of a near IR photosensitizer and a HABI photoinitiator. The preferred ratio range of photosensitizer to photoinitiator on a parts by weight basis is from about 0.04 to about 0.2.

The thickness of the photoimageable and/or photopolymerizable (photohardenable) layer will depend on the type of processing being done and is not limited.

Manufacturing Process

The process of formation of a dry film is relatively simple and direct. The stable liquid photoimageable and/or photopolymerizable composition(s) of the present invention is coated onto a substrate which may be permanent or temporary. Various methods of coating can be employed which are well known in the art.

Substantially all solvent(s) in the liquid composition is removed which results in a dry film. Since a relatively high solids content is present in the liquid, under preferred conditions it is considered that a relatively small amount of liquid has to be removed in forming a dry film.

PROCESS OF USE

The photoimageable and/or photopolymerizable compositions of this invention may be used to prepare photoresists, soldermasks, printing plates, and proofing products. These compositions are applied to a substrate by coating or lamination if a dry film as described above is prepared. After drying, the coating is imagewise exposed to actinic radiation, generally through a process negative or positive transparency after a draw-down time of 30 seconds to 2 minutes. The transparency is an image bearing transparency consisting solely of substantially opaque and substantially transparent areas where the opaque areas are substantially of the same optical density. The compositions used in the process of the invention generally exhibit their maximum sensitivity in the near infrared (near-IR) range, therefore the radiation source should furnish an effective amount of this type of radiation. Suitable radiation sources include diode lasers which emit in the near-IR range. The radiation exposure time can vary from fractions of a second to minutes depending on the intensity, type of radiation source used and its distance from the photoimageable/photopolymerizable layer and the type of photoimageable/photopolymerizable layer. In general exposure times range from 10 seconds to 10 minutes or more using standard non-laser commercial radiation sources and can be much shorter (milliseconds or less) using laser sources.

Following imagewise exposure to form imaged and non-imaged areas in the photoimageable/photopolymerizable composition, and removal of the cover sheet, if present, the exposed layer is developed to form an image on the first substrate. Developing of the exposed layer having imaged and non-imaged areas to form an image on the first substrate can be a dry development step, as in certain proofing applications, or it can be a wet development step, as in other proofing applications and as typical for photoresist, solder mask, and flexographic printing plate applications. The exposed layer may be developed using an aqueous alkaline developer, a semiaqueous developer, or a solvent developer which will remove the non-imaged areas leaving a relief image. If the first substrate is a copper-clad epoxy glass substrate, then the image formed is a resist image which may be used as a mask for etching or plating the copper exposed areas of the first substrate. If the first substrate is a metal substrate, such as anodized aluminum, then a printing plate results. The photoimageable layer may be pigmented resulting in a proofing product after wash-off development.

The exposed layer may also be developed by toning with a toning foil or film or by dusting with a powdered toner. Useful toning films are described in Froehlich, U.S. Pat. No. 3,625,014, issued Jul. 6, 1987. The films, which are comprised of a support and a low cohesive strength, pigmented polymer layer, are laminated to the exposed layer having imaged and non-imaged areas. The support is peeled off along with the pigmented polymer adjacent the imaged areas on the first substrate. In general, it is necessary to apply the toning film more slowly than usual lamination rates and some experimentation may be required to determine optimum rates and temperatures for laminating each different toning film.

Dry non-electroscopic toners, their method of production, as well as improved surface coatings, are well known in the art as, for example, in Chu and Manger, U.S. Pat. No. 3,620,726; Gray, U.S. Pat. No. 3,909,382; Fickes et al., U.S. Pat. No. 4,215,193; Fickes, U.S. Pat. No. 4,397,941; and Matrick, U.S. Pat. No. 4,546,072. The toner is applied to the exposed layer having non-tacky, imaged areas and tacky non-imaged areas. Excess toner is wiped off, providing a toner image on the first substrate.

The exposed layer having imaged and non-imaged areas may also be developed by peel-apart development. In this embodiment the photoimageable layer may be pigmented. A second substrate may be laminated to the photoimageable layer prior to the exposure step or after formation of the imaged and non-imaged areas in the exposed layer. The second substrate is then peeled off, resulting in the imaged areas remaining on the first substrate and the non-imaged areas being removed on the second substrate. If the photoimageable/photopolymerizable layer is unpigmented, the tacky non-imaged areas that are removed with the second substrate may be treated with dry particulate toners or toning films as described above.

DEFINITIONS

Effective Photopolymerization

Photopolymerization done under the compositions and processes of this invention is defined to be effective when the compositions, upon imagewise exposure to actinic radiation, are substantially unaffected by an aqueous (developer) solution (1% sodium carbonate by weight), a semiaqueous (developer) solution, or a solvent (developer) solution at a temperature of 30° C. for 1–2 minutes in portions exposed to actinic radiation but removed in portions not exposed to actinic radiation.

Effective Photoimaging

Photoimaging done under the compositions and processes of this invention, when not involving photopolymerization, is defined to be effective when the compositions, upon imagewise exposure to actinic radiation, undergo an increase in optical density of at least 0.2 optical density units in portions exposed to actinic radiation but undergo an increase of at most 0.1 optical density units in portions not exposed to actinic radiation. For photoimaging involving photopolymerization and washout, effective photoimaging is defined in the same manner as effective photopolymerization as given above.

Near Infrared (Near IR) Sensitive Dye

This is a dye which absorbs in the near infrared (near-IR) range (~770–1500 nm) of the electromagnetic spectrum and which is capable of activating a HABI photoinitiator to initiate photopolymerization of a photopolymerizable material and/or to initiate photoimaging of a photoimageable material via formation of a colored dye from a colorless or lightly colored dye precursor. An example of such color formation is the oxidation of a leuco dye to the colored dye form to generate the photoimage.

A Pair of Corresponding Heterocyclic Ring Structures

A pair of corresponding heterocyclic ring structures is defined to be two heterocyclic ring structures having the same number of atoms of each type and in which each atom is bonded to the same number and types of other atoms in each paired structure. The only difference between pairs is that some of the chemical bonds are different between the paired members (C—C single bond versus a C=C double bond) and that a heteroatom is quaternized in one member ($D_2$) of a given pair and not quaternized in the other member ($D_1$) of the given pair. Some illustrative examples of $D_1$ and $D_2$ paired members of different heterocyclic ring structures are given below in Table 2.

GLOSSARY

Near IR Dyes within Invention Scope

DF-1413
2-[2-[2-[2,4,6-trioxo-1,3-pyrimidin-5-yl]-3-[2-(1,3-dihydro-1-ethyl-3,3-dimethyl-2H-indol-2-ylidene)-ethylidene]-1-cyclopenten-1-yl]-ethenyl]-1-ethyl-3,3-dimethyl-3H-indolium, inner salt DF-1419
2-[2-[2-[2,4,6-trioxo-1,3-pyrimidin-5-yl]-3-[2-(1-ethyl-2(1H)quinolylidene)-ethylidene]-1-cyclopenten-1-yl]-ethenyl]-1-ethyl-quinolium, inner salt DF-1429
2-[2-[2-[2,4,6-trioxo-1,3-pyrimidin-5-yl]-3-[2-(1,3-dihydro-1,3,3-trimethyl-5-methoxy-2H-indol-2-ylidene)-ethylidene]-1-cyclopenten-1-yl]-ethenyl]-1,3,3-trimethyl-5-methoxy-3H-indolium, inner salt DF-1422
2-[2-[2-[2,4,6-trioxo-1,3-pyrimidin-5-yl]-3-[2-(1,3-dihydro-1,1,3-trimethyl-2H-benz[e]indol-2-ylidene)-ethylidene]-1-cyclopenten-1-yl]-ethenyl]-1,3-dihydro-1,1,3-trimethyl-2H-benz[e]indolium, inner salt DF-1668
2-[2-[2-[2,4,6-trioxo-1,3-pyrimidin-5-yl]-3-[1-ethyl-naphtho[1,2-d]thiazol-2(1H)-ylidene)-ethylidene]-1-cyclopenten-1-yl]-ethenyl]-1-ethyl-2H-naphtho[1,2-d]thiazolium, inner salt DF-12124
2-[2-[2-piperidino-3-[2-(1-ethyl-1,3-dihydrobenzothiazol-2-ylidene)-ethylidene]-1-cyclopenten-1-yl]ethenyl]-1-ethylbenzothiazolium, n-butyltriphenylboron salt DF-15118
2-[2-[2-[2,4,6-trioxo-1,3-pyrimidin-5-yl]-3-[3-ethyl-6-methoxy-2(3H)benzothiazolylidene)-ethylidene]-1-cyclopenten-1-yl]-ethenyl]-3-ethyl-6-methoxy-2(3H)-benzothiazolium, inner salt DF-15131
2-[2-[2-[2,4,6-trioxo-1,3-pyrimidin-5-yl]-3-[3-ethyl-2(3H) benzothiazolylidene)-ethylidene]-1-cyclopenten-1-yl]-ethenyl]-3-ethyl-2(3H)-benzothiazolium, inner salt DF-15132
2-[2-[2-[2,4,6-trioxo-1,3-pyrimidin-5-yl]-3-[3-(sulfopropyl)-5-trifluoro-methyl-2(3H) benzothiazolylidene)-ethylidene]-1-cyclopenten-1-yl]-ethenyl]-3-(3-sulfopropyl)-5-trifluoromethyl-2(3H)-benzothiazolium, bis-triethylammonium salt GW-826
2-[2-[2-2-piperdino-3-[2-(1-ethyl-1,3-dihydrobenzothiazol-2-ylidene)-ethylidene]-1-cyclopenten-1-yl]ethenyl]-1-ethylbenzothiazolium, bromide salt GW-436
2-[2-[2-2-morpholino-3-[2-(1-ethyl-1,3-dihydrobenzothiazol-2-ylidene)-ethylidene]-1-cyclohexen-1-yl]ethenyl]-1-ethylbenzothiazolium, bromide salt GW-776
2-[2-[2-4-carboethoxyhexahydropyrazino-3-[2-(1-ethyl-1,3-dihydrobenzothiazol-2-2-ylidene)-ethylidene]-1-cyclopenten-1-yl]ethenyl]-1-ethylbenzothiazolium, bromide salt GW-976
2-[2-[2-(2 aza-1,2,3,4-tetrahydronaphthalenyl)-3-[2-(1-ethyl-1,3-dihydrobenzothiazol-2-ylidene)-ethylidene]-1-cyclohexen-1-yl]ethenyl]-1-ethylbenzothiazolium, bromide salt GW-186
2-[2-[2-4-methylhexahydropyrazino-3-[2-(1-ethyl-1,3-dihydrobenzothiazol-2-ylidene)-ethylidene]-1-cyclohexen-1-yl]ethenyl]-1-ethylbenzothiazolium, tetrafluoroborate salt NK-2268
2-[2-[2-2-diphenylamino-3-[2-(1-ethyl-1,3-dihydrobenzothiazol-2-ylidene)-ethylidene]-1-cyclopenten-1-yl]ethenyl]-1-ethylbenzothiazolium, perchlorate salt NK-3877
2-[2-[2-diphenylamino-3-[2-(1-ethyl-6-methoxy-1,3-dihydrobenzothiazol-2-ylidene)-ethylidene]-1-cyclopenten-1-yl]ethenyl]-1-ethyl-6-methoxy-benzothiazolium, perchlorate salt HABIs

| | |
|---|---|
| CDM-HABI | 2-(o-chlorophenyl)-4,5-bis(m-methoxyphenyl)-imidazole dimer |
| o-Cl-HABI | 2,2'-bis(o-chlorophenyl)-4,4',5,5'-tetraphenyl-1,1'-biimidazole(CAS No. 1707-68-2) |
| 2,3,5-TCl-HABI | 2,2'-bis(2,3,5-trichlorophenyl)-4,4',5,5'-tetraphenyl-1,1'-biimidazole or 1,1'-Bi-1H-imidazole, 4,4',5,5'-tetraphenyl-2.2'-bis(2,3,5-trichlorophenyl)-(CA Index Name, CAS No. 154482-21-0) |
| TCTM-HABI | 1H-imidazole, 2,5-bis(o-chloro-phenyl)-4-[3,4-dimethoxyphenyl]-, dimer |

Leuco Dyes

| | |
|---|---|
| LBCV | Leuco butyl crystal violet; the formal chemical name is tris(N,N-dibutylaminophenyl)methane. |
| LCV | Leuco crystal violet; the formal chemical name is tris(N,N-dimethylaminophenyl)methane. |
| LECV | Leuco ethyl crystal violet; the formal chemical name is tris(N,N-diethylaminophenyl)methane. |
| LPCV | Leuco propyl crystal violet; the formal chemical name is tris(N,N-di-n-propylaminophenyl)methane. |
| LV-1 | Bis(4-N,N-diethylaminophenyl)(2-methyl-4-N,N-diethylaminophenyl)methane. |
| LV-2 | (4-N,N-Diethylaminophenyl)bis(2-methyl-4-N,N-diethylaminophenyl)methane. |
| LV-3 | Tris(2-methyl-4-N,N-diethylaminophenyl)methane. |

Monomers

| | |
|---|---|
| TMPEOTA | Ethoxylated trimethylolpropane triacrylate (= polyoxyethylated trimethylolpropane triacrylate) |
| TMPTA | Trimethylolpropane triacrylate |

Other Components (Name of Chain Transfer Agent(s))

| | |
|---|---|
| N-PhGly | N-Phenylglycine |
| Jul | Julolidine |
| DIDMA | 2,6-Diisopropyl-N,N-dimethylaniline |
| Binder Polymer | MMA/EA/MAA (44/35/21 wt. %) where MMA = methyl methacrylate EA = ethyl acrylate MAA = methacrylic acid |
| PET | Polyethylene terephthalate (Mylar ® film, DuPont, Wilmington, DE) |

EXAMPLES

The invention will now be illustrated, but not limited, by the following examples. Some of the examples as shown in Table 2 (i.e., DF-1429) were less efficient as photochemical sensitizers.

Example 1

A few of the near IR dyes mentioned in this disclosure are available from commercial sources. These dyes and the commercial source information are given below.

| Dye | Commercial Supplier |
|---|---|
| GW-826 | Preferred Chemicals Allied-Signal, Inc. P. O. Box 1053 101 Columbia Road Morristown, JR 07962-1053 |
| NK-2268 | Nippon Kankoh-Shikiso Kenyusho Ltd., Okayama, Japan |

Example 2

2-[2-[2-[2,4,6-trioxo-1,3-pyrimidin-5-yl]-3-[2-(1,3-dihydro-1-ethyl-3,3-dimethyl-2H-indol-2-ylidene)-ethylidene]-1-cyclopenten-1-yl]-ethenyl]-1-ethyl-3,3-dimethyl-3H-indolium inner salt (DF-1413)

The title compound was prepared as follows: 3-ethyl-1,1,2-trimethylindolenium iodide (3.15 g, 0.01 mol) and (5-(2,5-bis-anilinomethylene)cyclopentyllidene-1,3-dimethyl barbituric acid ("Compound B") (2.13 g, 0.005 mol) were mixed with 30 mL dimethylformamide. Triethylamine (1.151 g, 0.015 mol) was added and the mixture heated to 100–103° C. for 15 min. The mixture was cooled to room temperature and poured into 300 mL of stirred ethyl ether. The mixture was chilled, filtered, and the residue reslurried in ether. After filtering and air drying, 2.22 g of blue-violet crystals were obtained, mp 245–247° C., $\lambda$max(methanol)= 780 (e=292,000).

The reactants were prepared as follows:
3-Ethyl-1,1,2-trimethylindolenium iodide 1,1,2-Trimethylindolenine (22.71 g, 0.143 mol) and iodoethane (24.50 g, 0.157 mol) were dissolved in 32 mL ethyl acetate and heated to reflux for 3.5 hrs. The reaction mixture cooled to room temperature and the resulting precipitate collected by filtration. The material was washed with acetone until the washes were colorless. After drying, the yield was 16.33 g. Recrystallization from isopropanol yielded 15.93 g.

Compound B

5-Cyclopentylidene-1,3-dimethylbarbituric acid ("Compound A") (13.32 g, 0.06 mol) and ethyl isoformanilide (17.9 g, 0.12 mol) were dissolved in 40 mL dimethylformamide and heated to 123° C. for 50 min. After cooling to room temperature, 40 mL methanol was added and the entire mixture cooled to −5° C. The product was collected by filtration and reslurried in methanol. After filtration and air-drying, the yield of Compound B was 12.02 g, mp>350° C., max=545 (e=73,300).

Compound A 1,3-Dimethylbarbituric acid (23.4 g, 0.15 mol), cyclopentanone (12.6 g, 0.15 mol), ammonium acetate (3.6 g, 0.047 mol), 6 mL acetic acid, and 100 mL toluene were heated to reflux for 6 hours. After cooling to room temperature, 100 mL water were added and the mixture stirred for 30 min. The layers were separated and the organic phase washed twice with 100 mL water. After drying the organic phase over sodium sulfate, the toluene was removed by rotary evaporation and the residue recrystallized from 95% ethanol to give 23.68 g white crystals of Compound A, mp 109° C.

Example 3

2-[2-[2-[2,4,6-trioxo-1,3-pyrimidin-5-yl]-3-[2-(1-ethyl-2(1H)quinolylidene)-ethylidene]-1-cyclopenten-1-yl]-ethenyl]-1-ethyl-quinolium, inner salt (DF-1419)

The title compound was prepared as follows: 1-ethyl-2-methylquinolinium tosylate (3.43 g, 0.01 mol) and Compound B (2.14 g, 0.005 mol) were mixed with 30 mL dimethylformamide. Triethylamine (1.15 g, 0.015 mol) was added and the mixture heated to 100° C. for 25 min. The mixture was cooled to 10° C., filtered, and washed with acetone. The product was slurried in acetone, filtered, and dried to yield 2.26 g of copper-colored crystals, mp 280° C., max(methanol)=880 (e=166,000). Absorption at 485 nm indicates the presence of some half-adduct.

The reactants were prepared as follows: Compound B was made as above and 1-ethyl-2-methyl quinolinium tosylate was prepared as below: quinaldine (7.15 g, 0.05 mol) and ethyl tosylate (10 g, 0.05 mol) were heated in 20 mL o-xylene to 144° C. for 6.25 hrs. When the mixture was cooled to <60° C., acetone was added. After cooling to room temperature, the mixture was filtered and the crude product slurried three times in acetone to yield, after filtering and drying, 8.98 g reddish solid, mp 150° C.

Example 4

2-[2-[2-[2,4,6-trioxo-1,3-pyrimidin-5-yl]-3-[2-(1,3-dihydro-1,1,3-trimethyl-2H-benz[e]indol-2-ylidene)-ethylidene]-1-cyclopenten-1-yl]-ethenyl]-1,3-dihydro-1,1,3-trimethyl-2H-benz[e]indolium inner salt (DF-1422)

The title compound was prepared as follows: 1,1,2,3-tetramethyl-1H-benz(e)indolium tosylate (7.9 g, 0.02 mol) and Compound B (4.28 g, 0.01 mol) were mixed with 30 mL dimethylformamide. Triethylamine (3.0 g, 0.03 mol) was added and the mixture heated to 80–108° C. for 27 min. The mixture was cooled to room temperature, filtered, and washed with acetone. The product was slurried in acetone, filtered, and dried to yield 5.75 g (90%) of gold-green crystals, mp 282° C., max(methanol)=810 (e=242,000).

The reactants were prepared as follows: Compound B was made as above and 1,1,2,3-tetramethyl-1H-benz(e)indolium tosylate was prepared as below:

1,1,2-Trimethyl-1H-benz(e)indole (10.45 g, 0.05 mol), methyl tosylate (9.3 g, 0.05 mol), and 40 mL o-xylene were heated to 150° C. for 6 hrs. After cooling to 80° C., the mixture began to set up and acetone was quickly added. After cooling to room temperature, the mixture was filtered and washed with acetone. The product was slurried twice in acetone, filtered, and dried to yield 16.56 g of white powder, mp 212° C.

Example 5

2-[2-[2-(3,5-dimethyl-2,4,6-trioxo-1,3-pyrimidin-5-yl)-3-[2-(1,3-dimethyl-4,5-quinoxalino-imidazol-2-ylidene)-ethylidene]-1-cyclopenten-1-yl]-ethenyl]-1,3-dimethyl-4,5-guinoxalino-imidazolium inner salt (DF-13140)

The title compound was prepared as follows: 1,2,3-trimethyl-4,5-quinoxalino-imidazolium 4-toluenesulfonate (3.00 g, 0.0078 mol) and Compound B (1.66 g, 0.0039 mol) were mixed with 20 mL dimethylformamide. Triethylamine (0.79 g) was added and the mixture heated to 100° C. for 100 min. The mixture was cooled to room temperature and filtered. The product was slurried in acetone for one hour, filtered, and air-dried to to yield 2.02 g, mp 283–289° C., Amax(1% Acetic acid/methanol)=850 (e=213,000).

The reactants were prepared as follows: Compound B was made as above and 1,2,3-trimethyl-4,5-quinoxalino-imidazolium 4-toluenesulfonate was made as follows:

2,3-Bis-(3-methylamino)quinoxalinium 4-toluenesulfonate (4.04 g), prepared by reaction of methylamine with 2,3-dichloroquinoxaline, was refluxed with 420 mL acetic anhydride for two hours. After cooling to room temperature, the reaction mixture was poured into 3400 mL of stirred ethyl acetate. The resulting precipitate was filtered out and reslurried in acetone. Filtering and drying yielded 3.00 g, mp 253–258° C. (dec).

Example 6

2-[2-[2-[2,4,6-trioxo-1,3-pyrimidin-5-yl]-3-[1-ethyl-naphtho[1,2-d]thiazol-2(1H)-ylidene)-ethylidene]-1-cyclopenten-1-yl]-ethenyl]-1-ethyl-2H-naphtho[1,2-d]thiazolium, inner salt (DF-1668)

The title compound was prepared as follows: 1-ethyl-2-methylnaphtho[1,2-d]thiazolium tosylate (2.00 g, 0.005 mol) and Compound B (0.86 g, 0.0025 mol) were mixed with 35 mL dimethylformamide. Triethylamine (0.76 g, 0.0075 mol) was added and the mixture stirred at room temperature for 3.75 hrs. The mixture was filtered and the product reslurried in ethyl acetate. The product was collected by filtration and dried to yield 1.20 g, mp 246–249° C., Amax(methanol)=848 (e=231,000).

The reactants were prepared as follows: Compound B was made as above and 1-ethyl-2-methylnaphtho[1,2-d]thiazolium tosylate was prepared as follows:

2-Methylnaphtho[1,2-d]thiazole (19.9 g, 0.1 mol) and ethyl tosylate (20 g, 0.1 mol) were heated together to 170–180° C. for 7 hrs. When the mixture was cooled to <60° C., acetone was added. After cooling to room temperature, the mixture set-up, was filtered, and the crude product slurried three times in acetone to yield, after filtering and drying, ~20 g of product contaminated with starting material. The material was boiled with acetone for 30 min., filtered hot, and vacuum-dried to yield 11.36 g, mp 127–139° C.

Example 7

2-[2-[2-[2,4,6-trioxo-1,3-pyrimidin-5-yl]-3-[3-ethyl-6-methoxy-2(3H)benzothiazolylidene)-ethylidene]-1-cyclopenten-1-yl]-ethenyl]-3-ethyl-6-methoxy-2(3H)-benzothiazolium, inner salt (DF-15118)

The title compound was prepared as follows: 3-ethyl-6-methoxy-2-methylbenzothiazolium iodide (H. W. Sands, I-1032, 1.50 g, 0.00446 mol) and Compound B (0.82 g, 0.00223 mol) were mixed with 20 mL dimethylformamide. Triethylamine (0.67 g, 0.00669 mol) was added and the mixture stirred at room temperature for 55 min. The mixture was filtered and the product reslurried in ethyl acetate. The product was collected by filtration and dried to yield 1.19 g, mp 238° C., Amax(methanol)=826 (e=259,000).

Example 8

2-[2-[2-[2,4,6-trioxo-1,3-pyrimidin-5-yl]-3-[3-ethyl-2(3H)benzothiazolylidene)-ethylidene]-1-cyclopenten-1-yl]-ethenyl]-3-ethyl-2(3H)-benzothiazolium, inner salt (DF-15131)

3-Ethyl-2-methylbenzothiazolium iodide (H. W. Sands, I-1003, 2.00 g, 0.00656 mol) and Compound B (1.40 g, 0.00328 mol) were mixed with 60 mL dimethylformamide. Triethylamine (0.99 g, 0.00984 mol) was added and the mixture stirred at room temperature for 2 hrs. The mixture was filtered and the product reslurried in ethyl acetate. The product was collected by filtration and dried to yield 1.71 g, mp 256° C., λmax(methanol)=811 (e=259,000).

Example 9

2-[2-[2-[2,4,6-trioxo-1,3-pyrimidin-5-yl]-3-[3-(sulfopropyl)-5-trifluoro-methyl-2(3H) benzothiazolylidene)-ethylidene]-1-cyclopenten-1-yl]-ethenyl]-3-(3-sulfopropyl)-5-trifluoromethyl-2 (3H)-benzothiazolium, bis-triethylammonium salt (DF-15132)

2-Methyl-3-(3-sulfopropyl)-5-trifluoromethylbenzothiazolium, inner salt (H. W. Sands, I-1069, 2.03 g, 0.006 mol) and Compound B (1.28 g, 0.003 mol) were mixed with 80 mL dimethylformamide. Triethylamine (0.91 g, 0.009 mol) was added and the mixture stirred at room temperature for 9 hrs. The mixture was filtered and the filtrate poured into 400 mL of stirring ethyl acetate. After stirring 30 min., the product was collected by filtration and reslurried again in ethyl acetate. After filtration and drying, 2.42 g copper-colored powder was obtained, mp 218–230° C., λmax(methanol)=809 (e=280,000).

Example 10

2-[2-[2-Chloro-3-[3-ethyl-6-methoxy-2(3H) benzothiazolylidene)-ethylidene]-1-cyclopenten-1-yl]ethenyl]-3-ethyl-6-methoxy-2(3H)-benzothiazolium iodide (DF-15101)

The title compound was prepared as follows: 3-ethyl-6-methoxy-2-methylbenzothiazolium iodide (H. W. Sands, I-1032, 1.18 g, 0.005 mol), 2-chloro-3-(anilinomethylene)-1-(aniliniummethyl)-cyclopent-1-ene hydrochloride (0.86 g, 0.025 mol), and 20 mL dimethylformamide were mixed together. Acetic anhydride (1.2 mL) was added, followed by 0.76 g (0.0165 mol) triethylamine. The mixture was stirred and heated to 80–90° C. for 30 min. The mixture was chilled with a methanol-ice bath, then filtered. The filtrate was poured into 200 mL chilled ethyl acetate, stirred for one hour, and filtered. The product was reslurried in ethyl acetate, filtered, and air-dried to yield 0.55 g, mp 223–226° C., max(methanol)=807 (e=96,000). The reactants were prepared as follows:

2-chloro-3-(anilinomethylene)-1-(aniliniummethyl)-cyclopent-1-ene hydrochloride

The above reactant was prepared according to the procedures in U.S. Pat. No. 4,882,265 and E.P. 0 420 012 A1.

The other sensitizers within the scope of the invention as generically shown in Table 1 may readily be prepared according to the processes shown above or in the preceding examples or via analogous processes wherein 2 equivalents of the D moieties are coupled to 1 equivalent of the cyclopentyllidene-A moiety.

Examples 11–18

In these examples, each member of a set of near IR dyes was shown to be capable of inducing polymerization of a photopolymer washoff film composition upon imaging using a 820 nm diode laser operated at approximately 100 mW/cm2 intensity.

Each individual dye was tested as the photosensitizer component in a photopolymer washoff composition which consisted of the individual dye (0.25 g), TMPEOTA/TMPTA monomers (26.0 g/9.0 g), N-phenylglycine (0.50 g), an acrylic binder polymer (MMA/EA/MAA 44/35/21 wt. %; 0.50 g), and a HABI photoinitiator (2.0 g). Two separate sets of film samples were prepared and tested. In film set #1, the HABI photoinitiator was o-Cl-HABI, and in film set #2, the HABI photoinitiator was 2,3,5-TCl-HABI. The specific compositions tested are listed below. Example 12 contained DF-1413; 13/DF-1419; 14/DF-1668; 15/DF-15118; 16/DF-15131; 17/DF-15132; 18/GW-826; 19/NK-2268.

Each photopolymer film composition (12–19) was solvent-coated (from MEK, MEK/MeOH, or MeOH (5%)/$CH_2Cl_2$ at 33–35% total solids levels) to give a photopolymer dry film upon solvent removal (drying) that was 1–2 mils thick. For testing of each film sample, the following procedure was used. The photopolymer film was laminated onto a copper substrate, imaged using the 820 nm diode laser operated at a fluence of about 100 mW/cm2, and then processed (developed) on copper using a Chemcut® 547 aqueous processor operated at 85° F. with a developer solution of 1% aqueous sodium carbonate solution.

Each of the above photopolymer film samples afforded a well-defined imaged photopolymer (resist) pattern on the copper that corresponds to the negative of the phototool. More specifically, the unexposed (unimaged, unpolymerized) portions of resist were essentially completely removed in development, while the exposed (imaged, photopolymerized) portions were essentially completely intact on the copper substrate, which afforded the well-defined imaged resist pattern.

These examples demonstrate the photosensitizers of the invention are effective as near IR sensitizers of a HABI photoinitiator in initiating the polymerization of monomer(s) present in the photopolymer composition upon exposure to actinic radiation in the near IR range of the electromagnetic spectrum to afford photopolymerized photopolymer. These near IR sensitizers were effective in sensitizing both o-Cl-HABI (in film set #1) and 2,3,5-TCl-HABI (in film set #2).

Examples 19–24

In these examples, each member of a set of near IR dyes listed below was shown to be capable of inducing polymerization of a photopolymer washoff film composition upon imaging using a 790 nm diode laser operated at approximately 100 mW/cm2 intensity (power density).

Each individual dye was tested as the photosensitizer component in a photopolymer washoff composition which consisted of the individual dye (0.25 g), TMPEOTA/TMPTA monomers (26.0 g/9.0 g), N-phenylglycine (0.50 g), an acrylic binder polymer (MMA/EA/MAA 44/35/21 wt. %; 0.50 g), and 2,3,5-TCl-HABI photoinitiator. The specific compositions tested are listed below. Example 19 contained GW-826; 20/NK-3877; 21/KF-634; 22/KF-677; 23/KF-679; and 24/KF-681.

Each photopolymer film composition (19–24) was solvent-coated (from MEK, MEK/MeOH, or MeOH (5%)/$CH_2Cl_2$ at 33–35% total solids levels) to give a photopolymer dry film upon solvent removal (drying) that was 1–2 mils thick. For testing of each film sample, the following procedure was used. The photopolymer film was laminated onto a copper substrate, imaged using the 790 nm diode laser operated at a fluence of about 100 mW/cm2, and then processed (developed) on copper using a Chemcut® 547 aqueous processor operated at 85° F. with a developer solution of 1% aqueous sodium carbonate solution. The photopolymer film was laminated using a Riston® HRL-24 laminator operated at 1.5 meters/minute and at a temperature of 104° C.

Each of the above photopolymer film samples afforded a well-defined imaged photopolymer (resist) pattern on the copper that corresponds to the negative of the phototool. More specifically, the unexposed (unimaged, unpolymerized) portions of resist were essentially completely removed in development, while the exposed (imaged, photopolymerized) portions were essentially completely intact on the copper substrate, which afforded the well-defined imaged resist pattern.

These examples further demonstrate the photosensitizers within the scope of the invention are effective as near IR sensitizers of a HABI photoinitiator in initiating the polymerization of monomer(s) present in the photopolymer composition upon exposure to actinic radiation in the near IR range of the electromagnetic spectrum to afford photopolymerized photopolymer.

Example 25

In this example, dye DF-12124 was tested in the manner as outlined above for Examples 19–24 except that the 790 diode laser was operated at a power density of 511 mW/cm2; HABI photoinitiator was o-Cl-HABI at a level of 2.0 g in the photopolymerizable composition; and the chain transfer agent was triphenylbutylborate.

This photopolymer film sample afforded a well-defined imaged photopolymer (resist) pattern on the copper that corresponds to the negative of the phototool. More specifically, the unexposed (unimaged, unpolymerized) portions of resist were essentially completely removed in development, while the exposed (imaged, photopolymerized) portions were essentially completely intact on the copper substrate, which afforded the well-defined imaged resist pattern.

This example demonstrates that this particular near IR photosensitizer within the scope of the invention is effective as near IR sensitizer of a HABI photoinitiator in initiating the polymerization of monomer(s) present in the photopolymer composition upon exposure to actinic radiation in the near IR range of the electromagnetic spectrum to afford photopolymerized photopolymer.

Example 26

This example illustrates the effect of not including a near IR dye in the photopolymerizable composition. In this example, the testing was in the manner as outlined above for Example 25, using a 790 nm diode laser operated at a power density of 511 mW/cm2, except that no near IR dye was present and no chain transfer agent was present. No image was obtained upon development, indicating that a HABI photoinitiator alone in a photopolymerizable composition is insufficient to afford photopolymerization upon exposure to near IR actinic radiation. A suitable near IR photosensitizer within the scope of the invention is also needed in addition to a HABI photoinitator to afford photopolymerization using near IR actinic radiation.

Examples 27–29

These examples illustrate that the near IR dyes of this invention are very effective as photosensitizers of HABI photoinitiators even at very low power density levels of the actinic radiation source. In these examples, each member of a set of near IR dyes listed below was shown to be capable of inducing polymerization of a photopolymer washoff film composition upon imaging using a spectral sensitometer operated at approximately 2–5 mW/cm2 intensity (power density) and at a output wavelength (lambda(max)) that was adjustable and set at or very close to the wavelength of maximum absorption of the dye compound being tested.

Each individual dye was tested as the photosensitizer component in a photopolymer washoff composition which consisted of the individual dye (0.25 g), TMPEOTA/TMPTA monomers (26.0 g/9.0 g), N-phenylglycine (0.50 g), an acrylic binder polymer (MMA/EA/MAA 44/35/21 wt. %; 0.50 g), and either o-Cl-HABI or 2,3,5-TCl-HABI photoinitiator. The specific compositions tested and wavelength/power density settings for the spectral sensitometer are listed below. Example 27 contained GW-826/o-Cl-HABI/NPG with settings of 711 nm/5 mW/cm2; 28/DF-1413/o-Cl-HABI/NPG with settings of 780 nm/3 mW/cm2; and 29/DF-1413/2,3,5-TCl-HABI/Julolidine with settings of 780 nm/3 mW/cm2.

Each photopolymer film composition (19–24) was solvent-coated (from MEK, MEK/MeOH, or MeOH (5%)/ $CH_2Cl_2$ at 33–35% total solids levels) to give a photopolymer dry film upon solvent removal (drying) that was 1–2 mils thick. For testing of each film sample, the following procedure was used. The photopolymer film was laminated onto a copper substrate, imaged using the spectral sensitizer operated at the wavelength and the fluence as indicated above, and then processed (developed) on copper using a Chemcut® 547 aqueous processor operated at 85° F. with a developer solution of 1% aqueous sodium carbonate solution. The photopolymer film was laminated using a Riston® HRL-24 laminator operated at 1.5 meters/minute and at a temperature of 104° C.

Each of the above photopolymer film samples afforded a well-defined imaged photopolymer (resist) pattern on the copper that corresponds to the negative of the phototool. More specifically, the unexposed (unimaged, unpolymerized) portions of resist were essentially completely removed in development, while the exposed (imaged, photopolymerized) portions were essentially completely intact on the copper substrate, which afforded the well-defined imaged resist pattern.

These examples further demonstrate the photosensitizers within the scope of the invention are effective as near IR sensitizers of a HABI photoinitiator in initiating the polymerization of monomer(s) present in the photopolymer composition upon exposure to actinic radiation in the near IR range of the electromagnetic spectrum to afford photopolymerized photopolymer. Furthermore, the fact that these photosensitizers that are within the scope of the invention are very effective even at very low power density levels (~3–5 mW/cm2) strongly indicates that these photosensitizers operate predominantly by a photochemical mechanism (more efficient) as opposed to predominatly by a photothermal mechanism (much less efficient).

Example 30

In this example, a near IR dye within the scope of this invention is shown to be effective as a sensitizer of a HABI photoinitiator for photoimaging with a leuco dye, which is oxidized to the colored dye form to create the image.

A coating solution is prepared by mixing the following ingredients in the amounts indicated: acetone (65 g), diisopropylamine (1 g), p-formylphenoxyacetic acid (0.8 g), o-formylphenoxyacetic acid (0.8 g), nonylphenoxypoly (etheneoxy)ethanol (1.0 g), tricresyl phosphate (1.0 g), Leuco crystal violet (LCV, 0.4 g), DF-1413 dye (0.6 g), ethylenediamine tetraacetic acid (1.0 g), cellulose acetate butyrate (~27% butyryl content hydroxyl/2 anhydroglucose units, 6.0 g), 1-phenylpyrazolidine-3-one (0.048 g), and 2,3,5-TCl-HABI (0.32 g).

The solution is coated on Schweitzer 32-HG paper with a 0015 coating bar and then dried. Exposure through a phototool with a 820 nm diode laser operating at approximately a power density of 100 mW/cm2 affords a well-defined colored image as defined by the phototool.

Example 31

A coating solution is prepared by mixing the following ingredients in the amounts indicated: acetone (65 g), Leuco crystal violet (0.4 g), DF-1413 dye (0.6 g), 2,3,5-TCl-HABI (0.3 g), cellulose acetate butyrate (~27% butyryl content hydroxyl/2 anhydroglucose units, 8.0 g), triethanolamine triacetate (0.25 g), and 9,10-phenanthrenequinone (0.5 g).

The solution is coated on Schweitzer 32-HG paper with a 0015 coating bar and then dried. Exposure through a phototool with a 820 nm diode laser operating at approximately a power density of 100 mW/cm2 affords a well-defined colored image as defined by the phototool.

Example 32

The following example shows the use of a near infrared-sensitive photosensitizer of the present invention in a printing element that is photoimaged using a near IR light source.

A photosensitive element for use as a flexographic printing element includes a support, a coversheet and a photohardenable layer between the support and coversheet.

The support is a polyethylene terephthalate film. The support can be treated to improve adhesion by, for example, flame treatment or corona treatment.

The coversheet is a polyethylene terephthalate film coated with a release layer, for example, a thin polymeric layer of polyamide.

The photohardenable layer is prepared having the following composition, wherein the all parts are by weight:

| Function | Component | Parts |
|---|---|---|
| Binder | Styrene-butadiene-styrene block copolymer | 61.30 |
| Binder | Styrene-butadiene block copolymer | 9.90 |
| Polyoil plasticizer | 1,4-Polybutadiene, MW 300 | 18.80 |
| Monomer | Hexamethylenediol diacrylate | 6.90 |
| Solvent | Hydroxyethyl methacrylate | 0.2 |
| Antioxidant | Butyrated hydroxy toluene | 0.28 |
| Stabilizer | 1,4,4-Trimethyl-2,3-diazobicyclo(3.2.2)-non-2-ene-2,3-dioxide | 0.02 |
| Photoinitiator | o-Cl-HABI | 2.00 |
| Chain Transfer | 2MBO | 0.30 |
| Photosensitizer | GW-826 (near Infrared) Dye | 0.3 |
| | TOTAL | 100% |

The components for the photohardenable composition are solvent coated from a suitable solvent such as a toluene/acetone blend (e.g., 90/10) using a slot die coater operated at ambient temperature onto a PET support. A coversheet is applied on top of the photohardenable composition so that the photohardenable layer is sandwiched between the support and the coversheet. This 3-layer structure is the photosensitive element. It is wound onto a roll for storage until being used for making a flexographic printing plate.

The photosensitive element, as a printing element, is then processed to produce a flexographic printing plate. The photosensitive element is first given either a blanket ultra-violet light (UV) exposure through the support or a blanket near infrared exposure with the support removed in order to sensitize the plate and to polymerize the back side in order to establish the depth of the plate relief by creating a "floor". After the coversheet is removed (in case of a blanket UV exposure), the element is given an imagewise exposure through a phototool using near infrared radiation at a level of 100 mW/cm$^2$ for about 4 seconds (time units). The exposed element is washed in a processor using a suitable developer solvent, for example, tetrachloroethylene (TCE), or a mixture of a solvent, such as TCE, with suitable alcohols. The washed element will have a relief image for use as a flexographic printing plate. The plate is dried in an oven at 60° C. for about two hours. The plate is then uniformly post-exposed using the same source of near infrared radiation as the main exposure to insure complete polymerization. Optionally, if the plate surface is tacky, the plate may be detackified by treatment with bromine or chlorine solution, or exposure to radiation sources having a wavelength not longer than 300 nm. At this stage, the processed plate is now ready for use as a flexographic printing plate for printing.

Comparative Examples

In this comparative example, a photopolymer film was made and tested in the manner as given in Examples 27–29, except that SQS, a near IR dye photosensitizer that is very effective for thermal imaging (see U.S. Pat. No. 5,019,549), was used in equimolar levels in place of the near IR dyes tested in Examples 27–29. All other procedures were the same as previously described. Upon exposure and during the course of development, all of the photopolymer film was washed off the copper surface leaving a nearly bare or bare copper substrate with no image. This experiment indicates that the combination of SQS and a HABI photoinitiator is not capable of efficiently initiating the polymerization of monomer(s) in a photopolymer film upon exposure to near IR actinic radiation, such that both exposed and unexposed areas remain unpolymerized and are thus washed off in the course of development to afford a bare copper substrate. When used at significantly higher levels (e.g., 2.5% or more by weight) SQS is seen to initiate photopolymerization only at significantly higher intensities or power densities (megawatts/cm). As discussed elsewhere in the body of the specification, it is believed that the near IR photosensitizers of this invention work via a photochemical mechanism of energy transfer while SQS works less efficiently and only when present in higher levels via a photothermal mechanism of energy transfer.

TABLE 1

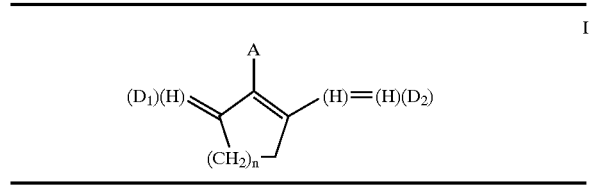

Where A =

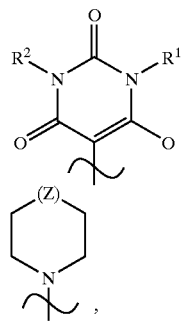

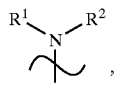

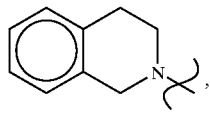

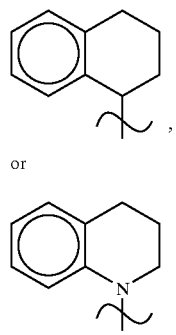

D1 =

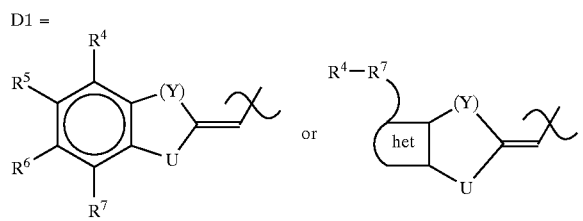

TABLE 1-continued

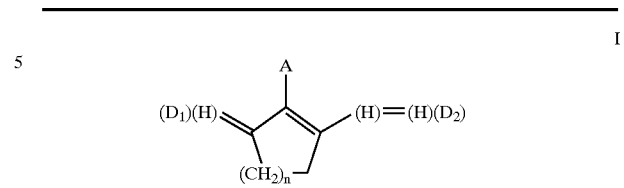

D2 =

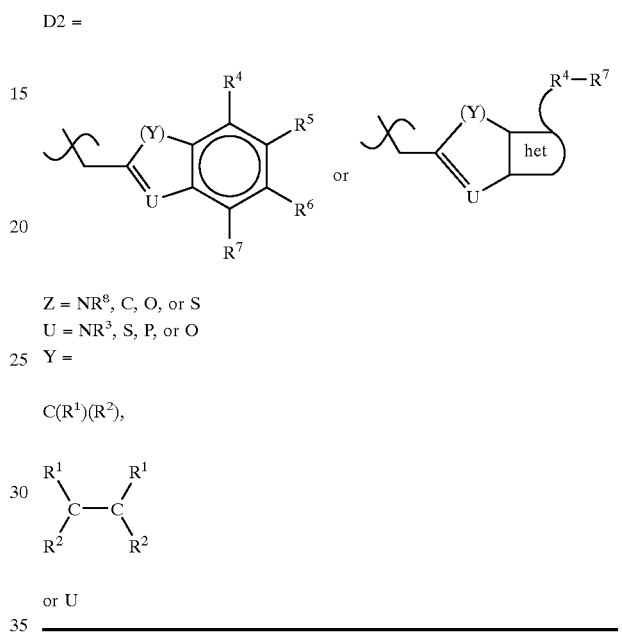

$Z = NR^8$, C, O, or S
$U = NR^3$, S, P, or O
Y =

$C(R^1)(R^2)$, $$\begin{array}{cc} R^1 & R^1 \\ -C-C- \\ R^2 & R^2 \end{array}$$

or U $R^1-R^2$ = H, $C_1-C_6$ alkyl; Ar, which is phenyl or napthyl which is unsubstituted or substituted with halogen atom, $O(C_1-C_6$ alkyl), $(C_6-C_{10})$ aryl, —Oaryl or $CF_3$: $(C_1-C_6)$ alkyl $(C_6-C_{10})$ aryl;

$R^3 = C_1-C_6$ alkyl unsubstituted or substituted with $CO_2H$, $SO_3H$ or salts thereof;

$R^4-R^7$ = H, halogen, $OCH_3$, $CF_3$ or any two of $R^4-R^7$ which are ortho to each other may form a phenyl ring which may be unsubstituted or substituted;

$R^8$ = H, $C_1-C_6$ alkyl, $CO_2H$, $CO_2-(C_1-C_6$ alkyl), $(CH_2)m$ $CO_2H$, $(CH_2)m$ $CO_2(C_1-C_6$ alkyl); and n = 1–2 m 0–6 het = a $C_6-C_{10}$ heteroatomic ring or fused ring having at least one heteratom selected from the group consisting of oxygen, nitrogen, and sulfur.

TABLE 2

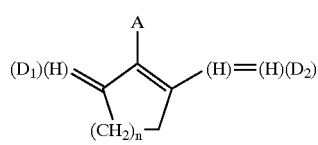

| Ex. No./Dye | Substituent A | Substituent D₁ | Substituent D₂ | n |
|---|---|---|---|---|
| DF-15131 | | | | 1 |

TABLE 2-continued
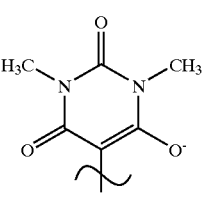
| Ex. No./ Dye | Substituent A | Substituent D₁ | Substituent D₂ | n |
|---|---|---|---|---|
| DF-15118 | 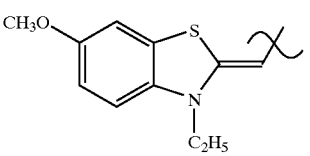 | 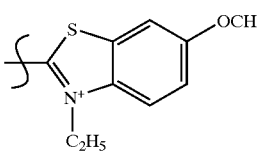 | 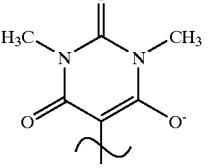 | 1 |
| DF-1668 | 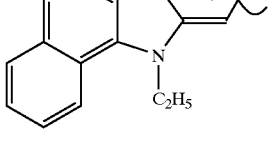 | 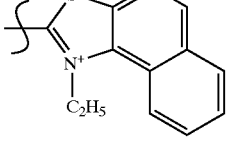 | 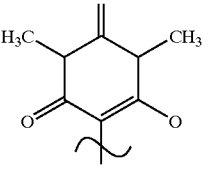 | 1 |
| DF-15132 | 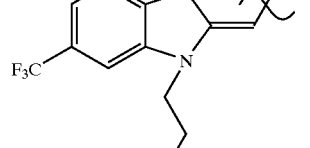 | 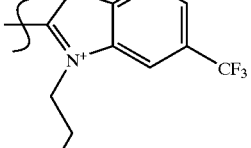 | 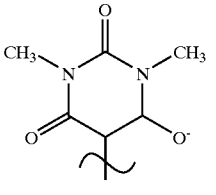 | 1 |
| DF-1422 | 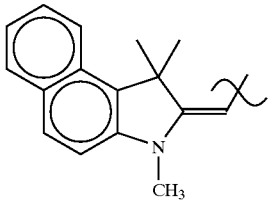 | 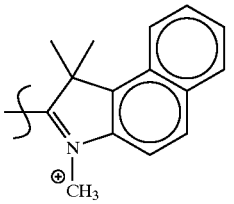 | 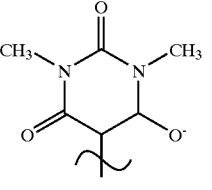 | 1 |
| DF-1429 | 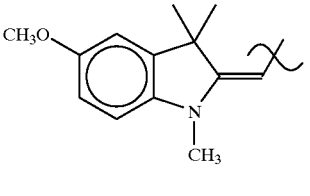 | 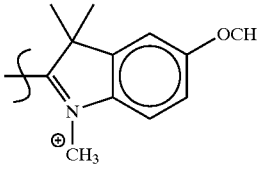 | 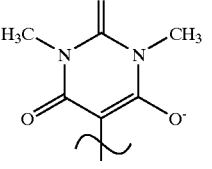 | 1 |
| DF-1413 | 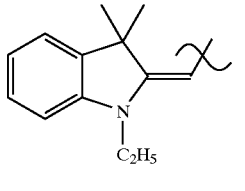 | 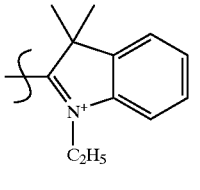 | | 1 |

TABLE 2-continued
| Ex. No./Dye | Substituent A | Substituent D₁ | Substituent D₂ | n |
|---|---|---|---|---|
| DF-1419 | 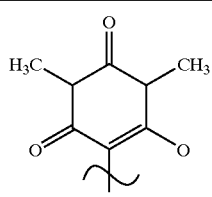 | 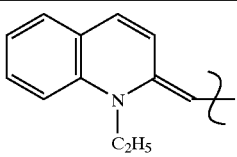 | 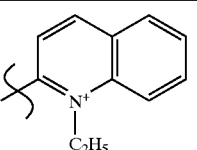 | 1 |
| NK-2268 | 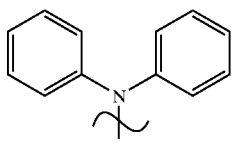 | 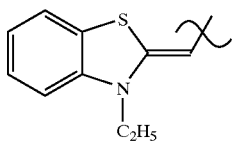 | 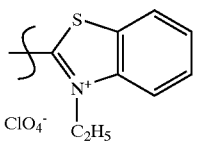 | 1 |
| NK-3877 | 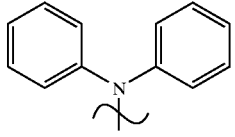 | 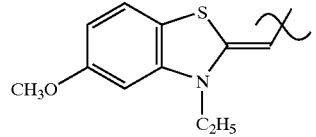 |  | 1 |
| GW-826 | 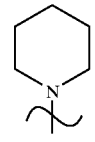 | 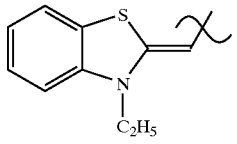 | 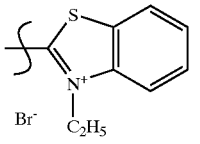 | 1 |
| DF-12124 | 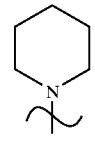 | 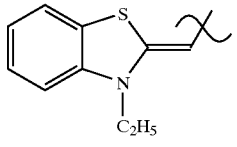 | 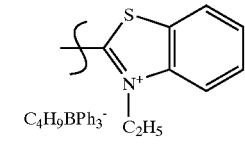 | 1 |
| GW-976 | 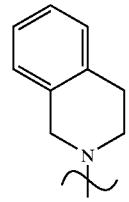 | 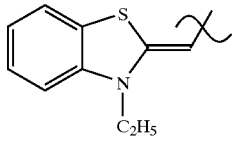 | 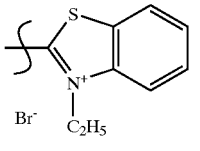 | 2 |
| GW-436 | 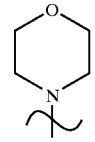 | 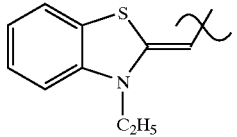 | 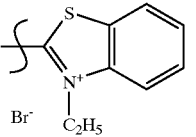 | 2 |
| GW-186 | 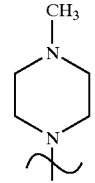 | 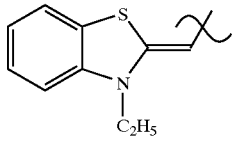 | 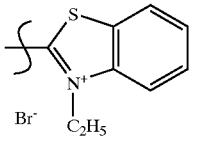 | 2 |

TABLE 2-continued

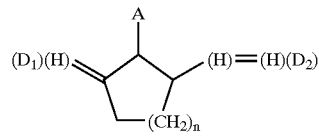

| Ex. No./ Dye | Substituent A | Substituent $D_1$ | Substituent $D_2$ | n |
|---|---|---|---|---|
| GW-776 | CO₂Et (piperazine structure) | benzothiazole with N-C₂H₅ | benzothiazole with N⁺-C₂H₅, Br⁻ | 2 |

What is claimed is:

1. A near infrared sensitive composition, comprising:
   (a) a near infrared dye photochemical sensitizer that enables the composition to undergo either
   (i) effective photopolymerization or
   (ii) effective photoimaging upon exposure to near infrared radiation, the near infrared dye is a compound of formula I:

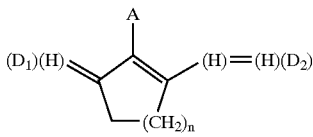

I wherein substituent A is chosen from
   (1) a 5–6 membered heterocyclic ring system having 1–3 ring heteroatoms, in which the heteroatom is a nitrogen atom, which is substituted with a hydrogen atom, $C_1$–$C_6$ alkyl, $(CH_2)_mCO_2H$ or $(CH_2)_mCO_2(C_1$–$C_6$ alkyl) and the carbon atom of the herocyclic ring system may be substituted with an oxygen atom to form a carbonyl or enolate anion and m is an integer ranging from 0–4;
   (2) a 5–6 membered carbocyclic moiety substituted with a hydrogen atom or a $C_1$–$C_6$ alkyl group wherein a carbon atom of the alkyl group may be substituted with oxygen to form a carbonyl or enolate anion;
   (3) a quinoline or isoquinoline group wherein the nitrogen atom is directly bonded to the carbocyclic moiety of formula I;
   (4) N,N-bisaryl or bis($C_1$–$C_6$ alkyl) or bisaryl ($C_1$–$C_6$ alkyl)amine wherein the aryl group is a naphthyl or phenyl group which is unsubstituted or substituted with a fluorine atom, bromine atom, chlorine atom, $OCH_3$, $CF_3$, OH, or $C_1$–$C_6$ alkyl;
   (5) a heterocyclic ring system having at least one nitrogen atom bonded directly to the carbocyclic ring of formula I and a group Z which is a carbon atom, $NR^8$, oxygen atom or sulfur atom wherein $R^8$ is a hydrogen atom, $C_1$–$C_6$ alkyl, $CO_2H$ or $CO_2C_1$–$C_6$ alkyl;
substituent $D_1$ is a 9–15 membered heterocyclic system comprising a heteroaryl ring system having at least one heteroatom group (U) which is an $NR^3$ group, oxygen atom, sulfur atom or $PR^3$ group which is directly bonded to the aryl portion of the heteroaryl ring system and wherein $R^3$ is a $C_1$–$C_6$ alkyl which may be unsubstituted or substituted with $CO_2H$, $SO_3H$ or salts thereof and wherein the aryl ring may be unsubstituted or substituted with $OCH_3$, $CF_3$, bromine atom, chlorine atom, fluorine atom, $C_1$–$C_6$ alkyl or OH or a fused ring polycyclic hetercyclic system;
substituent $D_2$ has the identical heterocyclic system as substituent $D_1$ except that when U is $NR^3$, the nitrogen atom is quaternized to form an amine salt which is neutralized by an enolate anion from A when A is a substituted pyrimidine like moiety or by a discrete (non intra-molecular) anion, provided that the discrete (non intra-molecular) anion is not a borate anion;
n is an integer ranging from 1–2;
   (b) a hexaarylbiimidazole compound as photoinitiator;
   (c) a photopolymerizable material and a chain transfer agent, or, instead of (c),
   (d) a photoimageable dye.

2. A photopolymerizable element comprising:
   (a) a support,
   (b) a photopolymerizable composition comprising
   (i) a near infrared dye photochemical sensitizer that enables the photopolymerizable composition to undergo effective photopolymerization upon exposure to near infrared radiation, the near infrared dye is a compound of formula I:

I wherein A is:
   (1) a 5–6 membered heterocyclic ring system having 1–3 ring heteroatoms, in which the heteroatom is a nitrogen atom which is substituted with a hydrogen atom, $C_1$–$C_6$ alkyl, $(CH_2)_mCO_2H$ or $(CH_2)_mCO_2(C_1$–$C_6$ alkyl) and the carbon atom of the heterocyclic ring system may be substituted with an oxygen atom to form a carbonyl or enolate anion and m is 0–4;

(2) a 5–6 membered carbocyclic moiety substituted with hydrogen atom, $C_1$–$C_6$ alkyl group wherein the carbon atom of the alkyl group may be substituted with oxygen to form a carbonyl or enolate anion;

(3) quinoline or isoquinoline groups wherein the nitrogen atom is directly bonded to the carbocyclic moiety of formula I;

(4) N,N-bisaryl or bis($C_1$–$C_6$ alkyl) or bisaryl($C_1$–$C_6$ alkyl) amine wherein the aryl group is a napthyl or phenyl group which is unsubstituted or substituted with fluorine atom, bromine atom, chlorine atom, $OCH_3$, $CF_3$, OH, $C_1$–$C_6$ alkyl;

(5) a heterocyclic ring system having at least one nitrogen atom bonded directly to the carbocyclic ring of formula I and a group Z which is a carbon atom, $NR^8$, oxygen atom, or sulfur atom wherein $R^8$ is a hydrogen atom, $C_1$–$C_6$ alkyl, $CO_2H$ or $CO_2C_1$–$C_6$ alkyl;

substituent $D_1$ is a 9–15 membered heterocyclic system comprising a heteroaryl ring having at least one heteroatom group (U) which is an $NR^3$ group, oxygen atom, sulfur atom, or $PR^3$ group which is directly bonded to the aryl portion of the heteroaryl ring system and wherein $R^3$ is a $C_1$–$C_6$ alkyl which may be unsubstituted or substituted with $CO_2H$, $SO_3H$ or salts thereof and wherein the aryl ring may be unsubstituted or substituted with $OCH_3$, $CF_3$, bromine atom, chlorine atom, fluorine atom, $C_1$–$C_6$ alkyl or OH or a fused ring polycyclic heterocyclic system;

substituent $D_2$ has the identical heterocyclic system as substituent $D_1$ except that when U is $NR_3$, the nitrogen atom is quaternized to form an amine salt which is neutralized by an enolate anion from A when A is a substituted pyrimidine like moiety or by a discrete (non intra-molecular) anion, provided that the discrete (non intra-molecular) anion is not a borate anion;

n is an integer ranging from 1–2;

(c) a hexaarylbiimidazole compound as photoinitiator;

(d) a photopolymerizable material and a chain transfer agent; and (e) a binder polymer.

3. A photopolymerizable element comprising:

(a) a support;

(b) a photopolymerizable composition comprising (i) a near infrared dye photochemical sensitizer that enables the photopolymerizerable composition to undergo effective photopolymerization upon exposure to neared infrared radiation, the near infrared dye is a compound of formula I:

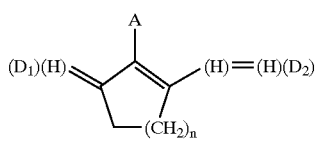

wherein A is

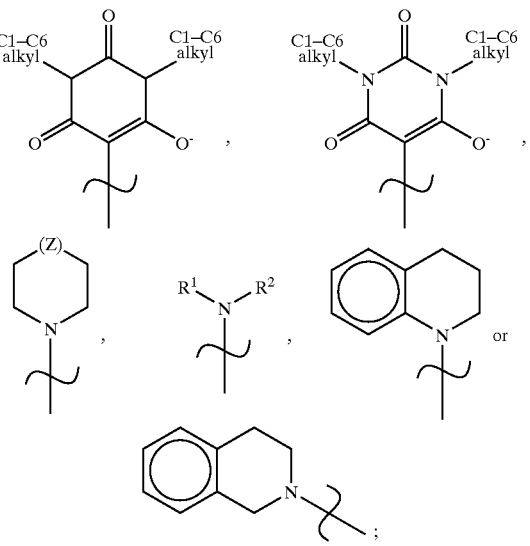

D1 represents a heterocyclic ring structure selected from the group consisting of:

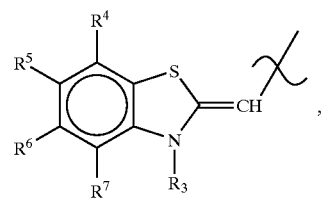

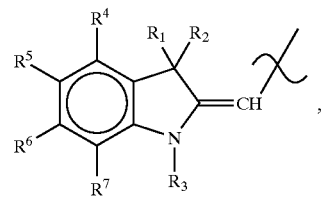

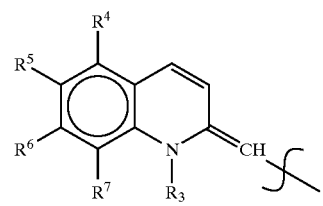

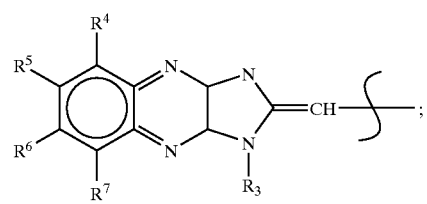

$D_2$ represents a heterocyclic ring structure selected from the group consisting of

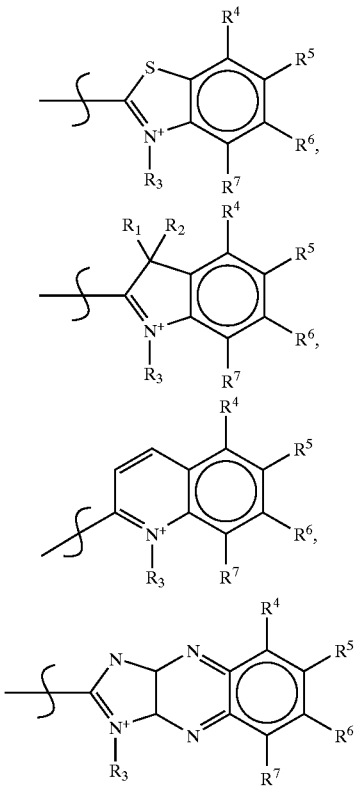

$R^1$ or $R^2$ are independently selected from:

$C_1$–$C_6$ alkyl, aryl wherein aryl is phenyl or napthyl which may be unsubstituted or substituted with halogen, —O($C_1$–$C_6$ alkyl), Oaryl, aryl or $CF_3$, ($C_1$–$C_6$ alkyl) aryl or hydrogen;

$R_3$ is $C_1$–$C_6$ alkyl, $C_1$–$C_6$ alkylsulfonate, $C_1$–$C_6$ alkyloxycarbonyl, $C_1$–$C_6$ alkyl, or $C_1$–$C_6$ alkylcarboxy;

Z is selected from $NR^8$, C, O or S wherein $R^8$ is H, $C_1$–$C_6$ alkyl, $CO_2H$ or $CO_2(C_1$–$C_6$ alkyl);

$R^4$–$R^7$ are independently selected from H, $OCH_3$, $CF_3$; or any two of $R^4$–$R^7$ which when ortho substituents may join to form a phenyl ring; n is an integer ranging from 1–2 with the proviso that $D_2$ is selected to be the quaternized heterocyclic ring structure that corresponds to $D_1$ such that $D_1$ and $D_2$ together form a pair of heterocyclic ring structures;

(c) a hexaarylbiimidazole compound as photoinitiator;

(d) a photopolymerizable material and a chain transfer agent; and (e) a binder polymer.

4. A near infrared sensitive composition, comprising:

(a) a near infrared dye photochemical sensitizer that enables the composition to undergo either
  (i) effective photopolymerization or
  (ii) effective photoimaging upon exposure to near infrared radiation wherein the near infrared dye is selected from the group consisting of DF-1413, DF-1419, DF-1422, DF-1429, DF-1668, DF-15118, DF-15131, DF-15132, NK-3877, GW-826, GW-436, GW-776, GW-976, and NK-2268;

(b) a hexaarylbiimidazole compound selected from the group consisting of o-Cl-HABI, CDM-HABI, 2,3,5-TCl-HABI, and TCTM-HABI; and (c) a photopolymerizable material selected from the group consisting of tripropylene glycol diacrylate, trimethylolpropane triacrylate, ethoxylated trimethylolpropane triacrylate, propoxylated trimethylolpropane triacrylate, ethoxylated Bisphenol A dimethacrylate, and triethylene glycol dimethacrylate, and a chain transfer agent selected from the group consisting of N-phenylglycine, julolidine, 2-mercaptobenzoxazole, 2,6-diisopropyl-N,N-dimethylaniline, a borate salt and an organic thiol.

5. A near infrared sensitive composition comprising:

(a) a near infrared dye photochemical sensitizer which is substantially free of borate anion that enables the composition to undergo either
  (i) effective photopolymerization or
  (ii) effective photoimaging upon exposure to near infrared radiation, the near infrared dye is a compound of formula I:

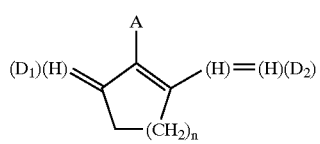

I wherein A is selected from the group consisting of

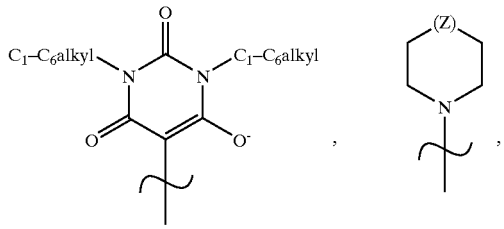

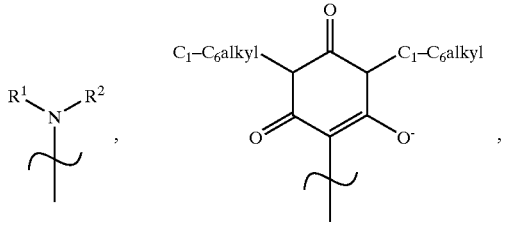

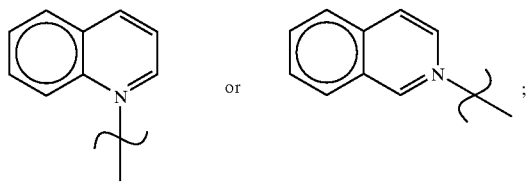

$D_1$ represents a heterocyclic ring structure selected from the group consisting of

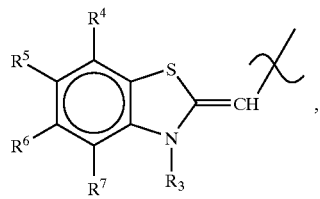

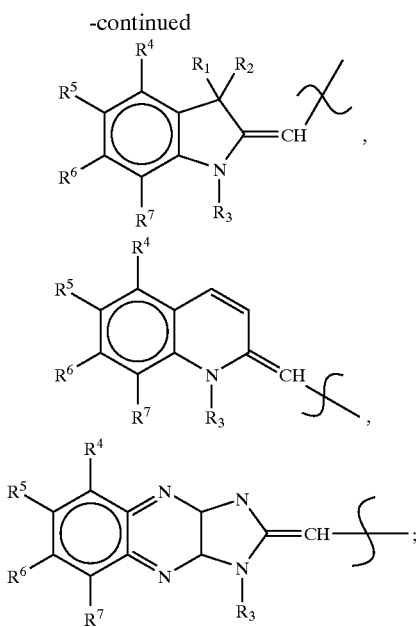

$D_2$ represents a heterocyclic ring structure selected from the group consisting of

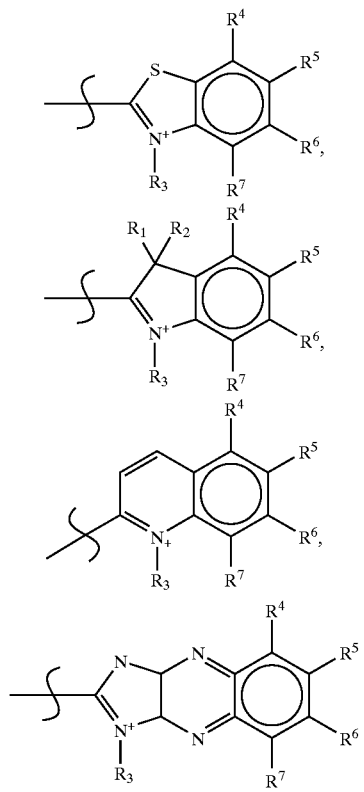

$R_1$ or $R_2$ are independently selected from: $C_1$–$C_6$ alkyl; aryl wherein aryl is phenyl or napthyl which may be unsubstituted or substituted with halogen, —O($C_1$–$C_6$ alkyl), Oaryl, aryl or phenyl, $CF_3$ ($C_1$–$C_6$ alkyl) ($C_1$–$C_{10}$ aryl) or hydrogen;

$R_3$ is $C_1$–$C_6$ alkyl, $C_1$–$C_6$ alkylsulfonate, $C_1$–$C_6$ alkyloxycarbonyl, $C_1$–$C_6$ alkyl, or carboxy $C_1$–$C_6$ alkyl;

Z is selected from $NR^8$, C, O or S wherein $R^8$ is H, $C_1$–$C_6$ alkyl, $CO_2H$ or $CO_2(C_1$–$C_6$ alkyl);

$R^4$–$R^7$ are independently selected from H, $OCH_3$, $CF_3$; or any two of $R^4$–$R^7$ which when ortho substituents may join to form a phenyl ring;

with the proviso that $D_2$ is selected to be the quaternized heterocylic ring structure that corresponds to $D_1$ such that $D_1$ and $D_2$ together form a pair of heterocyclic ring structures; and n is 1–2 provided that when A contains an enolate anion, a counterion $L^{\ominus}$ is not present;

(b) hexaarylbiimidazole compound as photoinitiator;

(c) a photopolymerizable material and a chain transfer agent; or, instead of (c);

(d) a photoimageable dye.

6. The composition according to claim 1, wherein the near infrared dye is selected from the group consisting of DF-1413, DF-1419, DF-1422, DF-1429, DF-1668, DF-15118, DF-15131, DF-15132, NK-3877, GW-826, GW-436, GW-776, GW-976, and NK-2268; the hexaarylbiimidazole compound is selected from the group consisting of o-Cl-HABI, CDM-HABI, 2,3,5-TCl-HABI, and TCTM-HABI; wherein the photopolymerizable material is selected from the group consisting of tripropylene glycol diacrylate, trimethylolpropane triacrylate, ethoxylated trimethylolpropane triacrylate, propoxylated trimethylolpropane triacrylate, ethoxylated Bisphenol A dimethacrylate, and triethylene glycol dimethacrylate, and the chain transfer agent is selected from the group consisting of N-phenylglycine, julolidine, 2-mercaptobenzoxazole, 2,6-diisopropyl-N,N-dimethylaniline, and an organic thiol; or the photoimageable dye is selected from the group consisting of LCV, LECV, LPCV, LBCV, LV-1, LV-2 and LV-3.

7. The composition according to claim 1, 2 or 3 wherein the near infrared dye is present in at least 0.5% by weight of the total composition; the hexaarylbiimidazole compound is present in at least 0.5% by weight of the total composition; and the photopolymerizable material is present in at least 20% by weight of the total composition and the chain transfer agent is present in at least 0.1% by weight of the total composition.

8. The composition according to claim 1 or 4 which further comprises a binder polymer.

* * * * *